United States Patent
Miyasita

(10) Patent No.: US 7,239,814 B2
(45) Date of Patent: Jul. 3, 2007

(54) DRIVING APPARATUS OF A LIGHT-EMITTING DEVICE

(75) Inventor: Tokio Miyasita, Kanagawa (JP)

(73) Assignee: Oki Electric Industry Co., Ltd., Minato-ku, Tokyo (JP)

( * ) Notice: Subject to any disclaimer, the term of this patent is extended or adjusted under 35 U.S.C. 154(b) by 710 days.

(21) Appl. No.: 10/773,336

(22) Filed: Feb. 9, 2004

(65) Prior Publication Data
US 2005/0025259 A1   Feb. 3, 2005

(30) Foreign Application Priority Data
Jul. 16, 2003   (JP)   ............................... 2003-198030

(51) Int. Cl.
H04B 10/12   (2006.01)
(52) U.S. Cl. ..................... 398/186; 398/195; 398/197; 398/200; 398/201
(58) Field of Classification Search ................ 398/186, 398/195, 197, 200, 201
See application file for complete search history.

(56) References Cited

U.S. PATENT DOCUMENTS 5,065,456 A * 11/1991 Nakayama ................. 398/197
5,371,763 A * 12/1994 Ota et al. .................... 375/319
5,612,810 A *  3/1997 Inami et al. ................ 398/202

FOREIGN PATENT DOCUMENTS

| JP | 06-232917  | 8/1994 |
| JP | 2000-174827 | 6/2000 |
| JP | 2001-036470 | 2/2001 |

* cited by examiner

Primary Examiner—Kenneth Vanderpuye
Assistant Examiner—Ken Malkowski
(74) Attorney, Agent, or Firm—Volentine & Whitt, PLLC

(57) ABSTRACT

A first peak hold circuit holds a peak potential of a positive phase voltage signal output from a differential output amplifier, and a second peak hold circuit holds a peak potential of a negative phase voltage signal output from the differential output amplifier. An adding circuit adds an output signal of the first peak hold circuit and an output signal of the second peak hold circuit. A differential input amplifier amplifies and outputs a voltage difference between a reference voltage and an addition result voltage signal of the adding circuit. A current output circuit outputs a DC current based on an output voltage of the differential input amplifier. A current switch circuit converts a DC current to a pulse current so as to supply the pulse current to a laser diode.

20 Claims, 24 Drawing Sheets

ZERO OFFSET, $Ib < Ith$

PLUS OFFSET, $Ib < Ith$

MINUS OFFSET, $Ib < Ith$

ZERO OFFSET, $Ib < Ith$

ZERO OFFSET
SAME "1 / 0" RATIO
AC COUPLED INPUT

ZERO OFFSET
AC COUPLED INPUT

ZERO OFFSET
AC COUPLED INPUT

ZERO OFFSET
$Ib = Ith (Ib > Ith)$

MINUS OFFSET
$Ib > Ith$

PLUS OFFSET
$Ib > Ith$ (LOW VR CASE)

PLUS OFFSET
$Ib = 0$ (HIGH VR CASE)

DRIVING APPARATUS OF A LIGHT-EMITTING DEVICE

BACKGROUND OF THE INVENTION

1) Field of the Invention

The present invention relates to a driving apparatus of a light-emitting device.

2) Description of the Related Art

Recently, an optical signal is used for signal transmission via a communication line and network, because the optical signal offers advantages such as enlarging the capacity of information carried and accelerating the information transmission speed. An electrical signal output from various information equipment such as a computer and a telephone is converted to the optical signal in an optical communication apparatus and supplied to an optical communication line and network. A laser diode (LD), which has extremely high frequency response and is easily miniaturized, is widely used for a photoelectric conversion device included in the optical communication apparatus.

In order to carry out a stabile optical communication, it is necessary to constantly monitor an optical output from the laser diode and to control an operation of the laser diode. In general, the laser diode for the optical communication is accompanied by an optical feedback circuit so as to automatically adjust a driving current. The optical feedback circuit includes components such as a photodiode for monitoring backward light (optical output) of the laser diode, a current-to-voltage conversion circuit for converting an output current from the photodiode to a voltage, an operational amplifier section, and a reference voltage circuit section. The aforementioned circuit is referred to as an APC (Automatic Power Control) circuit, since the circuit automatically stabilizes the optical output from the laser diode.

The optical communication apparatuses including the APC circuits are disclosed in Japanese Patent Kokai No. 6-232917, Japanese Patent Kokai No. 2000-174827 and Japanese Patent Kokai No. 2001-36470.

When an offset voltage of the operational amplifier included in a driving control circuit for the laser diode increases, the control of the driving current flowing through the laser diode becomes unstable, because an optical amplitude value or an optical peak value can not be accurately detected. The offset voltage is caused by, for example, a piece-to-piece variation of the operational amplifiers or a fluctuation of an ambient temperature around the optical communication apparatus. When a driving bias current far exceeds a light-emitting threshold value, a light-emitting state remains during an off period of the light output from the laser diode, and thus an optical noise increases during the off period. Accordingly, an on/off ratio (extinction ratio) is deteriorated. On the other hand, when the driving bias current decreases, a transient response time from an optical turning off to an optical turning on is delayed, thereby causing a delay in the light output from the laser diode.

In this connection, when a capacitor is connected in series to an output terminal of the operational amplifier included in the APC circuit, a DC (direct current) component is cut off from a current output from the operational amplifier, thereby extracting only an amplitude component. Consequently, the offset voltage of the operational amplifier does not affect the control of the driving current for the laser diode.

However, in a conventional APC circuit with the series-connected capacitor, when a probability of appearances of "1" and "0" in each transmitted frame data signal significantly fluctuates, a DC potential after the series-connected capacitor varies, and thus the control of the driving current flowing through the laser diode becomes unstable. Therefore, the laser diode including the aforementioned APC circuit can not be used for the transmissions other than the transmission of a balanced-sign, in which the probability of appearances of "1" and "0" in each transmitted frame data signal is constant. Accordingly, the laser diode including the aforementioned APC circuit is not suitable for a stable output of a signal having a changing probability of appearances of "1" and "0" such as a burst signal.

SUMMARY OF THE INVENTION

An object of the present invention is to provide a novel and improved driving apparatus of a light-emitting device which can properly control a driving current of the light-emitting device, and also achieve stable transmission of a burst signal even though an operational amplifier included in an APC circuit (control circuit) has an offset voltage.

According to a first aspect of the present invention, there is provided a driving apparatus of a light-emitting device for driving an light-emitting device to generate an optical pulse signal based on a transmission pulse signal. The driving apparatus of a light-emitting device includes a light-receiving device for receiving monitoring light emitted from the light-emitting device and outputting a light-receiving current signal, a current-to-voltage conversion section for converting the light-receiving current signal to a voltage signal, an AC coupling amplifier section for amplifying an AC component of a voltage signal output from the current-to-voltage conversion section and outputting an AC amplified signal, a differential output section for amplifying the AC amplified signal and outputting a positive phase voltage signal and a negative phase voltage signal, a first detecting circuit for detecting a peak value or a bottom value of the positive phase voltage signal and outputting a voltage depending on the peak value or the bottom value, a second detecting circuit for detecting a peak value or a bottom value of the negative phase voltage signal and outputting a voltage depending on the peak value or the bottom value of the negative phase voltage signal, a first reference voltage circuit for generating a first reference voltage, a first calculation section for adding an output voltage of the first detecting circuit and an output voltage of the second detecting circuit, and for outputting a voltage depending on a difference between a result of the adding and the first reference voltage, a first DC current output section for outputting a first DC current depending on a calculation result of the first calculation section, a pulse current output section for converting the first DC current to a pulse current depending on the transmission pulse signal so as to supply the pulse current to the light-emitting device, and a bias current output section for supplying a bias current to the light-emitting device.

A driving apparatus of a light-emitting device according to a second aspect of the present invention includes a light-receiving device for receiving monitoring light emitted from the light-emitting device and outputting a light-receiving current signal, a current-to-voltage conversion section for converting the light-receiving current signal to a voltage signal, an AC coupling amplifier section for amplifying an AC component of a voltage signal output from the current-to-voltage conversion section and outputting an AC amplified signal, a differential output section for amplifying the AC amplified signal and outputting a positive phase voltage signal and a negative phase voltage signal, a first detecting circuit for detecting a peak value or a bottom value of the positive phase voltage signal and outputting a voltage depending on the peak value or the bottom value, a second detecting circuit for detecting a peak value or a bottom value of the negative phase voltage signal and outputting a voltage depending on the peak value or the bottom value of the negative phase voltage signal, a first reference voltage circuit for generating a first reference voltage, a first calculation section for adding an output voltage of the first detecting circuit and an output voltage of the second detecting circuit, and for outputting a voltage depending on a difference between a result of the adding and the first reference voltage, a bias current output section for supplying a bias current depending on a calculation result of the first calculation section to the light-emitting device, and a pulse current output section for supplying a pulse current depending on the transmission pulse signal to the light-emitting device.

A driving apparatus of a light-emitting device according to a third aspect of the present invention includes a light-receiving device for receiving monitoring light emitted from the light-emitting device and outputting a light-receiving current signal, a current-to-voltage conversion section for converting the light-receiving current signal to a voltage signal, a differential output amplifier section for amplifying a voltage signal output from the current-to-voltage conversion section, and for outputting a positive phase voltage signal and a negative phase voltage signal, a first detecting circuit for detecting a peak value or a bottom value of the positive phase voltage signal and outputting a voltage depending on the peak value or the bottom value, a second detecting circuit for detecting a peak value or a bottom value of the negative phase voltage signal and outputting a voltage depending on the peak value or the bottom value of the negative phase voltage signal, a first reference voltage circuit for generating a first reference voltage, a first calculation section for adding an output voltage of the first detecting circuit and an output voltage of the second detecting circuit, and for outputting a voltage depending on a difference between a result of the adding and the first reference voltage, a second reference voltage circuit for generating a second reference voltage, a second calculation section for outputting a voltage depending on a difference between an output voltage of the first detecting circuit or an output voltage of the second detecting circuit and the second reference voltage, a first DC current output section for outputting a first DC current depending on a calculation result of the first calculation section, a pulse current output section for converting the first DC current to a pulse current depending on the transmission pulse signal so as to supply the pulse current to the light-emitting device, and a bias current output section for supplying a bias current depending on a calculation result of the second calculation section to the light-emitting device.

A driving apparatus of a light-emitting device according to a fourth aspect of the present invention includes a light-receiving device for receiving monitoring light emitted from the light-emitting device and outputting a light-receiving current signal, a current-to-voltage conversion section for converting the light-receiving current signal to a voltage signal, a third reference voltage circuit for generating a third reference voltage, a differential input differential output amplifier section for amplifying an electrical potential difference between a voltage signal output from the current-to-voltage conversion section and the third reference voltage so as to output a positive phase voltage signal and a negative phase voltage signal, a first detecting circuit for detecting a peak value or a bottom value of the positive phase voltage signal and outputting a voltage depending on the peak value or the bottom value, a second detecting circuit for detecting a peak value or a bottom value of the negative phase voltage signal and outputting a voltage depending on the peak value or the bottom value of the negative phase voltage signal, a first reference voltage circuit for generating a first reference voltage, a first calculation section for adding an output voltage of the first detecting circuit and an output voltage of the second detecting circuit, and for outputting a voltage depending on a difference between a result of the adding and the first reference voltage, a first DC current output section for outputting a first DC current depending on a calculation result of the first calculation section, a pulse current output section for converting the first DC current to a pulse current depending on the transmission pulse signal so as to supply the pulse current to the light-emitting device, and a bias current output section for supplying a bias current to the light-emitting device.

A driving apparatus of a light-emitting device according to a fifth aspect of the present invention includes a light-receiving device for receiving monitoring light emitted from the light-emitting device and outputting a light-receiving current signal, a current-to-voltage conversion section for converting the light-receiving current signal to a voltage signal, a third reference voltage circuit for generating a third reference voltage, a differential input differential output amplifier section for amplifying an electrical potential difference between a voltage signal output from the current-to-voltage conversion section and the third reference voltage so as to output a positive phase voltage signal and a negative phase voltage signal, a first detecting circuit for detecting a peak value or a bottom value of the positive phase voltage signal and outputting a voltage depending on the peak value or the bottom value, a second detecting circuit for detecting a peak value or a bottom value of the negative phase voltage signal and outputting a voltage depending on the peak value or the bottom value of the negative phase voltage signal, a first reference voltage circuit for generating a first reference voltage, a first calculation section for adding an output voltage of the first detecting circuit and an output voltage of the second detecting circuit, and for outputting a voltage depending on a difference between a result of the adding and the first reference voltage, a bias current output section for supplying a bias current depending on a calculation result of the first calculation section to the light-emitting device, and a pulse current output section for supplying a pulse current depending on the transmission pulse signal to the light-emitting device.

A driving apparatus of a light-emitting device according to a sixth aspect of the present invention includes a light-receiving device for receiving monitoring light emitted from the light-emitting device and outputting a light-receiving current signal, a current-to-voltage conversion section for converting the light-receiving current signal to a voltage signal, a third reference voltage circuit for generating a third reference voltage, a differential input differential output amplifier section having two input terminals, a positive phase output terminal and a negative phase output terminal, for receiving a voltage signal output from the current-to-voltage conversion section at one of the two input terminals and receiving the third reference voltage at the other input terminal, and for outputting a positive phase voltage signal from the positive phase output terminal and outputting a negative phase voltage signal from the negative phase output terminal, a first detecting circuit for detecting a peak value or a bottom value of the positive phase voltage signal and outputting a voltage depending on the peak value or the bottom value, a second detecting circuit for detecting a peak value or a bottom value of the negative phase voltage signal and outputting a voltage depending on the peak value or the bottom value of the negative phase voltage signal, a first reference voltage circuit for generating a first reference voltage, a first calculation section for adding an output voltage of the first detecting circuit and an output voltage of the second detecting circuit, and for outputting a voltage depending on a difference between a result of the adding and the first reference voltage, a second reference voltage circuit for generating a second reference voltage, a second calculation section for outputting a voltage depending on a difference between an output voltage of the first detecting circuit or an output voltage of the second detecting circuit and the second reference voltage, a first DC current output section for outputting a first DC current depending on a calculation result of the first calculation section, a pulse current output section for converting the first DC current to a pulse current depending on the transmission pulse signal so as to supply the pulse current to the light-emitting device, and a bias current output section for supplying a bias current depending on a calculation result of the second calculation section to the light-emitting device.

When the offset voltage exists in a differential output section, there is concern that the offset voltage component is included in a positive phase voltage signal and a negative phase voltage signal output from the differential output section. In this connection, the driving apparatus of the present invention processes the positive phase voltage signal and the negative phase voltage signal in the first calculation section so as to remove the offset voltage component. Based on the calculation result in the first calculation section, a level of a first DC current is adjusted. Accordingly, an operation of the light-emitting device is stably controlled without being influenced by the offset voltage in the differential output section. Furthermore, the driving apparatus of the present invention performs stable transmission of a signal having variable probability of appearances of "1" and "0" in each transmitted frame data signal such as burst signal.

As described above, the present invention can properly control the driving current of the light-emitting device without having an influence of the offset voltage in the amplifier section included in the circuit. Furthermore, the present invention can control the operation of the light-emitting device with high accuracy even though the light-emitting device is used for transmitting the burst signal.

DETAILED DESCRIPTION OF THE INVENTION

Preferred embodiments of a driving apparatus of a light-emitting device according to the present invention will be hereinafter described in detail with reference to the accompanying drawings. It should be noted that the same numerical references are assigned to elements having substantially the same functions or configurations in the following description and the accompanying drawings so as to omit repeated description.

Figure 1:
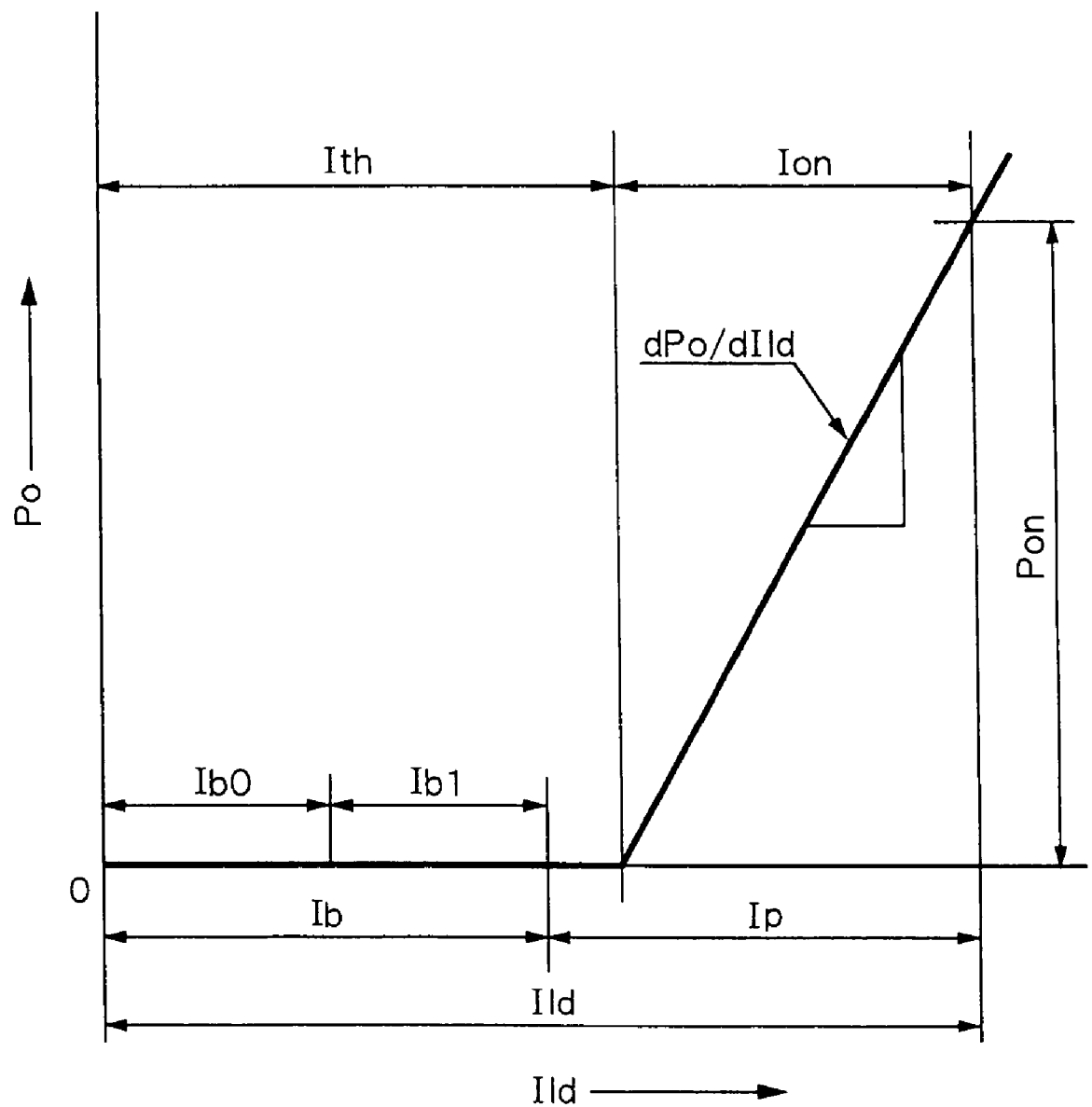
FIG. 1 is a characteristic drawing showing a relationship between a driving current and an optical output of a laser diode.

Firstly, driving control of a laser diode (example of a light-emitting device) used in optical communications is described with reference to FIG. 1. FIG. 1 shows a relationship between a driving current I1d and an optical output Po from the laser diode.

When the driving current I1d flows through the laser diode, an optical output Pon is generated. When the driving current I1d is lower than a light-emitting threshold current Ith, a laser oscillation does not take place. Accordingly, no light is emitted from the laser diode.

When the driving current I1d increases and exceeds the light-emitting threshold current Ith, the laser diode starts the laser oscillation, and thus outputs laser light. After the laser oscillation, the optical output Pon in proportion to a light-emitting-on-state current Ion (Ion=I1d−Ith) is generated (dpo/dI1d(=dpo/dIon)).

When the driving current I1d is intermittently applied to the laser diode, a pulsed optical output Pon is generated. This performs communication by means of an optical pulsed signal. As mentioned above, when the driving current I1d is lower than the light-emitting threshold current Ith, the optical output Pon is in the off-state. In this instance, when the driving current I1d is set to too low, it takes a long time until the subsequent driving current I1d exceeds the light-emitting threshold current Ith. Consequently, turning on the optical output Pon is delayed.

When the driving current I1d during an optical turning off is set to extremely lower than the light-emitting threshold current Ith, transition from the optical turning on to the optical turning off will be performed earlier. This phenomenon in combination with the aforementioned delay of the optical turning on reduces a pulse width of the optical output Pon as compared with a time width of data to be transmitted by the laser diode.

In order to prevent the delay of the laser light emission and to ensure the suitable time width of the optical output, as a general method, a slightly less current (DC bias current Ib) than the light-emitting threshold current Ith is precedently applied to the laser diode, and then a driving pulse current Ip is applied to the laser diode. In this instance, the driving pulse current Ip (peak value) plus the DC bias current Ib coincides with the driving current I1d.

The relationship among the driving current I1d, the light-emitting threshold current Ith, the light-emitting-on-state current Ion, the DC bias current Ib, and the driving pulse current Ip is shown below.

$$I1d = Ith + Ion = Ib + Ip$$

When the ambient temperature around the laser diode fluctuates, a value of the light-emitting threshold current Ith and a proportional gradient (dPo/dI1d) of the light-emitting-on-state current Ion fluctuate, which may destabilize the optical output Pon. As a measure against the destabilization, the laser diode is generally provided with the aforementioned APC circuit. The laser diode can output light (monitoring laser light) corresponding to the communicating laser light in a backward direction, in addition to communicating laser light (optical output Pon) corresponding to the optical communication output in a forward direction. Alternatively, the monitoring laser light may be generated by branching off a part of the communicating laser light. The APC circuit is provided with a photodiode which receives the monitoring laser light. The DC bias current Ib and the pulse current Ip are controlled based on an output from the photodiode. Consequently, the communicating laser light, which is adjusted to have a predetermined pulse width and a power, is output from the laser diode.

When higher accuracy is required for an adjustment of the pulse width and the on/off timing of the optical output Pon, it is preferable to concurrently control the DC bias current Ib and the driving pulse current Ip so as to constantly coincide the value of the DC bias current Ib with a value of the threshold current Ith, i.e., the driving pulse current Ip is made equal to the light-emitting-on-state current Ion. However, it is difficult to control both of the DC bias current Ib and the driving pulse current Ip to be ideal values. Therefore, in many cases of driving control of the laser diode for the optical communication, either one of DC bias current Ib or the driving pulse current Ip is fixed to a predetermined value, and the other is controlled.

Specifically, either one of the following control methods is applied; a method of predicting a fluctuation of the light-emitting threshold current Ith so as to set the DC bias current Ib to the minimum value of the predicted fluctuation, and controlling the driving pulse current Ip, or a method of predicting a fluctuation of the light-emitting-on-state current Ion so as to set the driving pulse current Ip to the maximum value of the predicted fluctuation, and controlling the DC bias current Ib. The above control methods stabilize the operation of the laser diode, and thus an intended optical output Pon is obtained.

The laser diode for the optical communication is driven and controlled based on the aforementioned control scheme. Driving apparatuses of light-emitting devices according to embodiments of the present invention will be now described.

First Embodiment of Driving Apparatus

Figure 2:
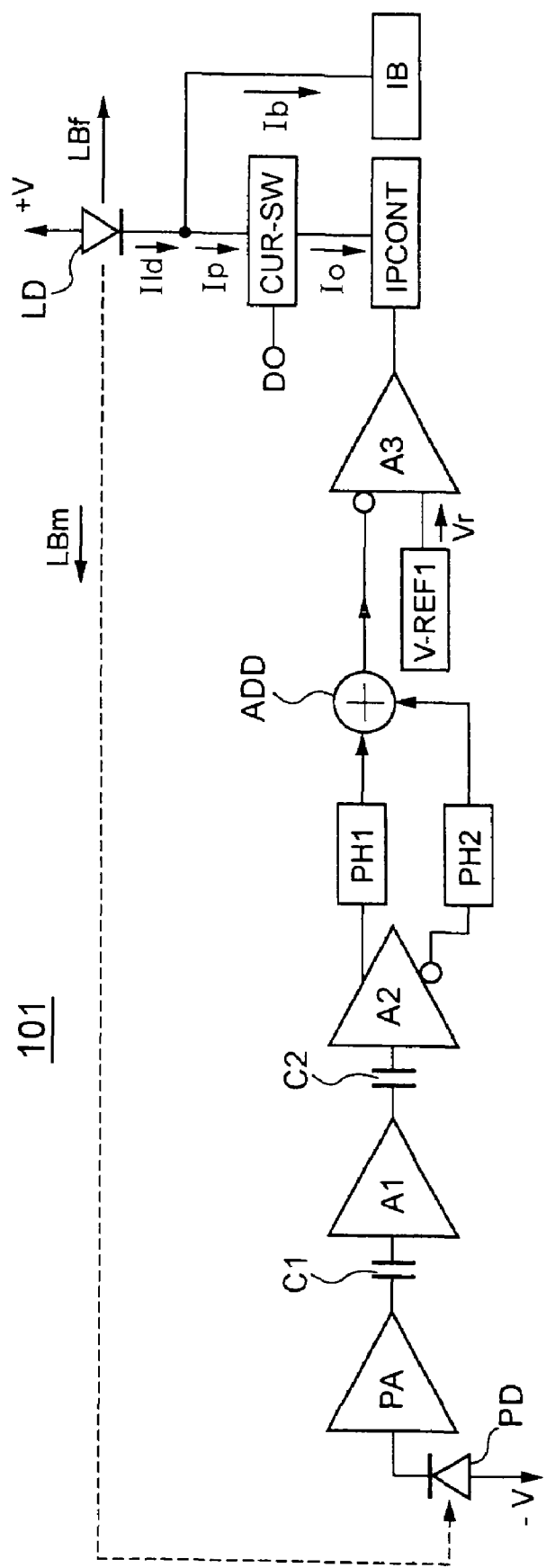
FIG. 2 is a block diagram showing a structure of a laser diode driving circuit according to a first embodiment of the present invention.

A laser diode driving circuit (a driving apparatus of a light-emitting device) 101 according to a first embodiment of the present invention is shown in FIG. 2.

The laser diode driving circuit 101 includes a laser diode LD (light-emitting device), a photodiode PD (light-receiving device), a preamplifier section PA (current-to-voltage converting section), a capacitor C1, an AC (Alternating Current) signal amplifier A1, a capacitor C2, a differential output amplifier A2 (differential output section), a first peak hold circuit PH1 (first detector circuit), a second peak hold circuit PH2 (second detector circuit), an adding circuit ADD, a reference voltage circuit V-REF1 (first reference voltage circuit), a differential input amplifier A3, a current output circuit IPCONT (first DC current output section), a current switch circuit CUR-SW (pulse current output section), and a bias current circuit IB (bias current output section). The capacitor C1, the AC signal amplifier A1, and the capacitor C2 form an AC coupling amplifier section. The adding circuit ADD and the differential input amplifier A3 form a first calculation section.

An anode of the laser diode LD is connected to a supply line of a power supply potential +V, and a cathode of the laser diode LD is connected to an output terminal of the current switch circuit CUR-SW and an output terminal of the bias current circuit IB. The laser diode LD, driven by the driving current I1d flowing through the cathode, outputs the communicating laser light LBf (optical output Pon) for the optical communication in a forward direction as well as the light (monitoring laser light LBm) corresponding to the communicating laser light in a backward direction.

The photodiode PD receives the monitoring laser light LBm from the laser diode LD transmitted through an optical feedback line, and then outputs a light-receiving current signal after photoelectric transformation. A cathode of the photodiode PD shown in FIG. 2 is connected to an input terminal of the preamplifier section PA, and an anode thereof is connected to a supply line of a power supply potential −V. As an alternative, the circuit may be configured such that the anode of the photodiode PD is connected to the preamplifier section PA, and a cathode thereof is connected to a supply line of a power supply potential +V.

The polarity (current direction) of the light-receiving current signal output from the photodiode PD differs depending on the circuit configuration of the photodiode PD. As shown in FIG. 2, when the cathode of the photodiode PD is connected to the input terminal of the preamplifier section PA, the light-receiving current signal has a current direction flowing into the cathode. Reversely, when the anode of the photodiode PD is connected to the input terminal of the preamplifier section PA, the light-receiving current signal has a current direction flowing off from the anode.

Figure 3:
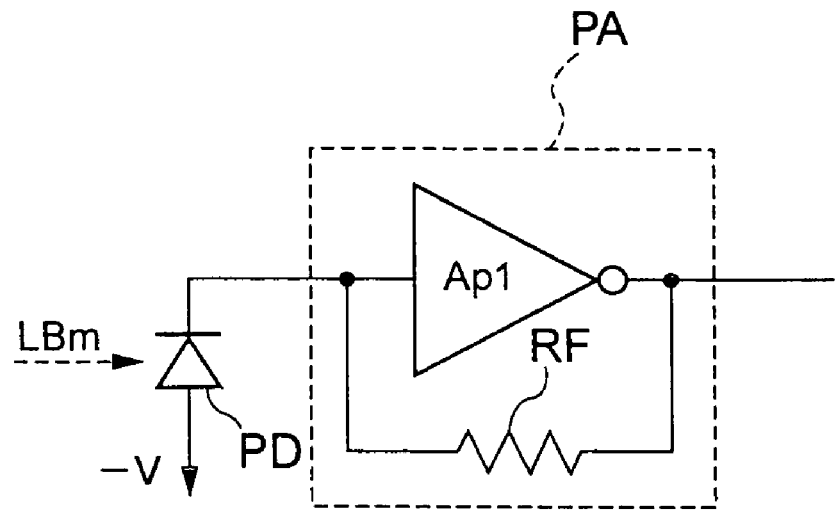
FIG. 3 is a circuit diagram showing an internal structure of a preamplifier section included in the laser diode driving circuit shown in FIG. 2.
Figure 4:
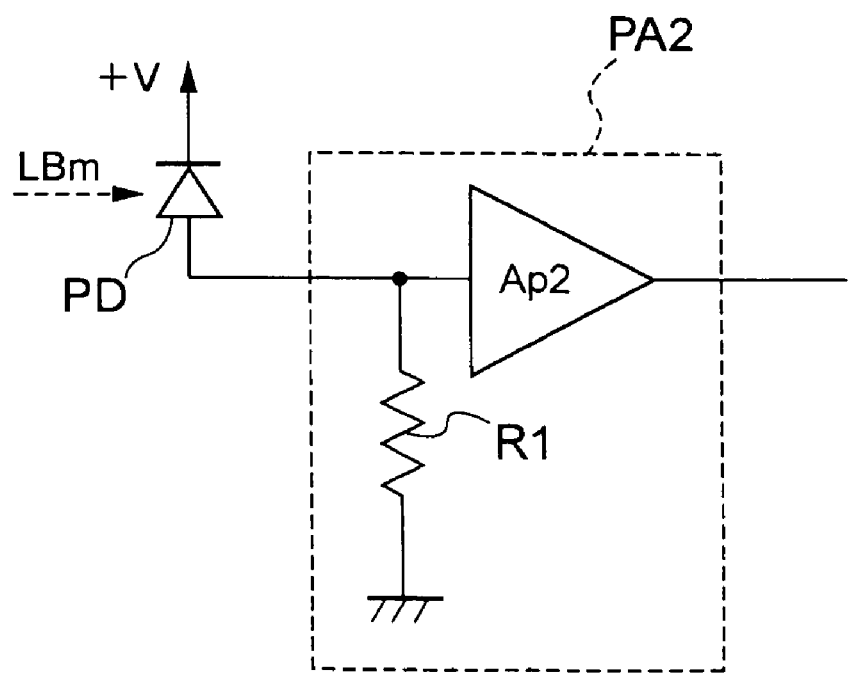
FIG. 4 is a circuit diagram showing an internal structure of another preamplifier section.

An input terminal of the AC signal amplifier A1 is AC coupled to an output terminal of the preamplifier section PA via the capacitor C1, and an output terminal of the AC signal amplifier A1 is AC coupled to an input terminal of the differential output amplifier A2 via the capacitor C2. As shown in FIG. 3, the preamplifier section PA includes an amplifier Ap1 having reversed phases with respect to input and output and a negative feedback resistance RF. The negative feedback resistance RF is directly connected to an input terminal and an output terminal of the amplifier Ap1. As shown in FIG. 4, a preamplifier section PA2 including an amplifier Ap2 and an input resistance RI may be used instead of the preamplifier PA. The input resistance RI is connected between an input terminal of the amplifier Ap2 and the grounding line.

A positive phase output terminal of the differential output amplifier A2 is connected to an input terminal of the first peak hold circuit PH1, and a negative phase output terminal of the differential output amplifier A2 is connected to an input terminal of the second peak hold circuit PH2.

A first input terminal of the adding circuit ADD is connected to an output terminal of the first peak hold circuit PH1, a second input terminal of the adding circuit ADD is connected to an output terminal of the second peak hold circuit PH2, and an output terminal of the adding circuit ADD is connected to a negative phase input terminal of the differential input amplifier A3. A positive phase input terminal of the differential input amplifier A3 is connected to an output terminal of the reference voltage circuit V-REF1.

An output terminal of the differential input amplifier A3 is connected to an input terminal of the current output circuit IPCONT, and an output terminal of the current output circuit IPCONT is connected to an input terminal of the current switch circuit CUR-SW.

An operation of the laser diode driving circuit 101 of this embodiment having the afore-described configuration is now described.

The bias current circuit IB supplies the DC bias current Ib, which is adjusted to have a slightly lower value than the light-emitting threshold current Ith, to the laser diode LD. The current output circuit IPCONT supplies a DC current Io to the current switch circuit CUR-SW. A value of the DC current Io varies depending on an operation of circuits before the current output circuit IPCONT.

The current switch circuit CUR-SW converts the DC current Io received from the current output circuit IPCONT to the driving pulse current Ip based on a transmission signal D, and supplies the driving pulse current Ip to the laser diode LD.

The laser diode LD, which is driven by a current (driving current $I1d$) obtained from the summation of the DC bias current Ib and the pulse current Ip, transmits the communicating laser light LBf toward a destination terminal (not shown) of the communication. The laser diode LD also transmits the monitoring laser light LBm to the optical feedback line.

When the pulse current Ip is output by the current switch circuit CUR-SW, the driving current $I1d$ (=DC bias current Ib+pulse current Ip) exceeds the light-emitting threshold current Ith. Consequently, the laser diode LD emits the communicating laser light LBf and the monitoring laser light LBm. On the contrary, when no pulse current Ip is output by the current switch circuit CUR-SW, the driving current $I1d$ (=DC bias current Ib) is lower than the light-emitting threshold current Ith. Consequently, the laser diode LD does not emit the communicating laser light LBf and the monitoring laser light LBm.

The photodiode PD receives the monitoring laser light LBm via the optical feedback line, and then converts the monitoring laser light LBm to the light-receiving current signal. It should be noted that when the monitoring laser light LBm is a pulse light, the light-receiving current signal becomes a pulse signal.

The preamplifier section PA converts the light-receiving current signal output from the photodiode PD to a voltage signal.

The voltage signal output from the preamplifier section PA is amplified by the AC signal amplifier A1 provided between the preamplifier section PA and the differential output amplifier A2. It should be noted that the preamplifier section PA may be directly connected to the differential output amplifier A2 by omitting the AC signal amplifier A1, the capacitor C1 and the capacitor C2. It should also be noted that provision of the AC signal amplifier A1 before the differential output amplifier A2 as shown in the laser diode driving circuit 101 of this embodiment realizes the AC signal amplifier A2 having a decreased gain.

The differential output amplifier A2 converts an AC signal amplified by the AC signal amplifier A1 to differential output signals including a positive phase voltage signal and a negative phase voltage signal. The positive phase voltage signal and the negative phase voltage signal have the same amplitude with respect to each other.

The first peak hold circuit PH1 holds a peak potential of the positive phase voltage signal output from the differential output amplifier A2, and the second peak hold circuit PH2 holds a peak potential of the negative phase voltage signal output from the differential output amplifier A2. The first peak hold circuit PH1 and the second peak hold circuit PH2 output voltages corresponding to the peak values. Alternatively, the first peak hold circuit PH1 and the second peak hold circuit PH2 may be replaced by a first bottom hold circuit and a second bottom hold circuit which respectively hold bottom values of the positive phase voltage signal and the negative phase voltage signal and output voltages corresponding to the bottom values.

The adding circuit ADD adds an output signal of the first peak hold circuit PH1 and an output signal of the second peak hold circuit PH2, and outputs an addition result as an addition result voltage signal.

The differential input amplifier A3 amplifies and outputs a voltage difference between a reference voltage Vr output from the reference voltage circuit V-REF1 and the addition result voltage signal output from the adding circuit ADD. It should be noted that when the first peak hold circuit PH1 and the second peak hold circuit PH2 are respectively replaced by the first bottom hold circuit and the second bottom hold circuit, the connections of the differential inputs to the differential input amplifier A3 are reversed.

The current output circuit IPCONT outputs a DC current Io based on an output voltage from the differential input amplifier A3. For example, when the output voltage from the differential input amplifier A3 is increased, the current output circuit IPCONT decreases the DC current Io. Reversely, when the output voltage from the differential input amplifier A3 is decreased, the current output circuit IPCONT increases the DC current Io.

The current switch circuit CUR-SW is on/off controlled based on the transmission signal D. The current switch circuit outputs the DC current Io when the current switch circuit is in the on state. The operation of the current switch circuit CUR-SW converts the DC current Io to a pulse current Ip, and the pulse current Ip is supplied to the laser diode LD.

The bias current circuit IB constantly supplies the DC bias current Ib to the laser diode LD.

Because of the afore-described operations in the sections of the laser diode driving circuit 101 of this embodiment, the amplitude of the optical output Pon from the laser diode LD is maintained at a constant value.

Next, detailed driving control over the laser diode LD in the laser diode driving circuit 101 of this embodiment will be described with reference to FIG. 5.

In order to easily understand the characteristics of this embodiment, an operation of the laser diode driving circuit 101 will be hereinafter described based on a case where the capacitor C1, the AC signal amplifier A1 and the capacitor C2 are omitted from the laser diode driving circuit 101, namely, the preamplifier section PA is directly connected to the differential output amplifier A2. An operation of the laser diode driving circuit 101 having the capacitor C1, the AC signal amplifier A1 and the capacitor C2 will be described later.

Figure 5A:
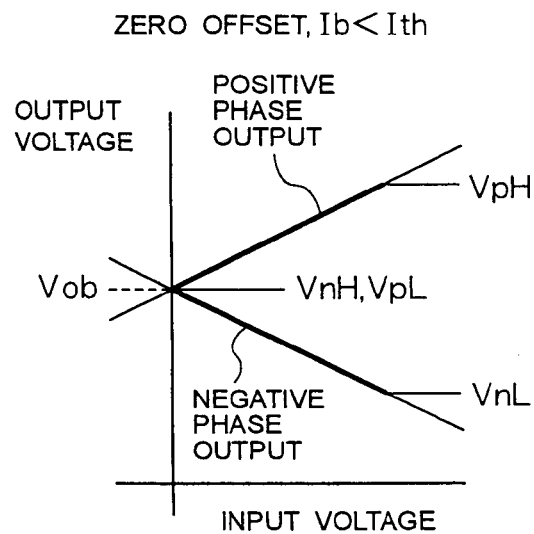
FIGS. 5A to 5D are characteristic drawings each showing a relationship between an input voltage and an output voltage of a differential output amplifier included in the laser diode driving circuit shown in FIG. 2.

FIG. 5A shows an operation of the differential output amplifier A2 when an output offset voltage of the differential output amplifier A2 is zero, namely, the differential output amplifier A2 is configured by an ideal operational amplifier.

When the laser diode LD does not emit the communicating laser light LBf and the monitoring laser light LBm, the photodiode PD does not output the light-receiving current signal, and thus no input is supplied to the preamplifier section PA. Accordingly, both potentials of the positive phase voltage signal and the negative phase voltage signal output from the differential output amplifier A2 coincide with the bias potential Vob.

When the laser diode LD emits the pulsed communicating laser light LBf and the pulsed monitoring laser light LBm, the photodiode PD receives the pulsed monitoring laser light LBm and outputs the pulsed light-receiving current signal to the preamplifier section PA. In response to the light-receiving current signal, the differential output amplifier A2 outputs the pulsed positive phase voltage signal having a bottom (minimum) potential VpL and a peak potential VpH from the positive phase output terminal, and outputs the pulsed negative phase voltage signal having a bottom potential VnL and a peak potential VnH from the negative phase output terminal. It should be noted that the bottom potential VpL of the positive phase voltage signal and the peak potential VnH of the negative phase voltage signal coincide with the bias potential Vob.

The relationships among the potentials are shown below:

$$VpH - VpL = VnH - VnL = \Delta V \quad (1)$$

$$VpL = VnH = Vob \quad (2)$$

When quantity of the pulsed communicating laser light LBf and the pulsed monitoring laser light LBm from the laser diode LD are increased, namely, the amplitude of the optical output Pon from the laser diode LD is increased, a potential level of the voltage signal of the preamplifier section PA is increased. Accordingly, the peak potential VpH of the positive phase voltage signal is increased, and the bottom potential VnL of the negative phase voltage signal is decreased. Consequently, values on both sides of the equation (1) are increased keeping an equal relationship between the left side and the right side of the equation (1). On the other hand, as shown in the equation (2), the bottom potential VpL of the positive phase voltage signal and the peak potential VnH of the negative phase voltage signal are fixed to the bias potential Vob. Since an output Vadd from the adding circuit ADD coincides with a summation of the peak potential VpH of the positive phase voltage signal and the peak potential VnH of the negative phase voltage signal, the following equation can be obtained which is obvious from the FIG. 5A:

$$Vadd = VpH + VnH = \Delta V + 2 \times Vob \quad (3)$$

It should be noted that when the connection polarity of the photodiode PD to the preamplifier section PA is reversed, an increased amplitude of the optical output Pon decreases the voltage signal output from the preamplifier section PA. In this instance, an output relationship between the positive phase and the negative phase of the differential outputs of the differential output amplifier A2 is switched.

Next, an operation of the differential output amplifier A2 when the output offset voltage of the differential output amplifier A2 is positive is described with reference to the FIG. 5B. When the differential output amplifier A2 has a positive output offset voltage, the potential of the positive phase voltage signal is higher than that of the negative phase voltage signal during no input to the differential output amplifier A2, namely, during neither the communicating laser light LBf nor the monitoring laser light LBm being emitted from the laser diode LD.

It should be noted that the output offset voltage of the differential output amplifier A2 is caused by a leak current of the photodiode PD and/or an offset voltage of the preamplifier section PA, in addition to manufacturing tolerance of the differential output amplifier A2 or a fluctuation of an ambient temperature.

When the laser diode LD emits the pulsed communicating laser light LBf and the pulsed monitoring laser light LBm, the photodiode PD receives the pulsed monitoring laser light LBm and outputs the pulsed light-receiving current signal to the preamplifier section PA. In response to the light-receiving current signal, the differential output amplifier A2 outputs the pulsed positive phase voltage signal having a bottom potential VpL1 and a peak potential VpH1 from the positive phase output terminal, and outputs the pulsed negative phase voltage signal having a bottom potential VnL1 and a peak potential VnH1 from the negative phase output terminal. It should be noted that the bottom potential VpL1 of the positive phase voltage signal represents a potential of the positive phase output terminal when an input voltage to the differential output amplifier A2 is zero. The potential is higher than the bias potential Vob by the output offset voltage. The peak potential VpH1 of the positive phase voltage signal is also higher by the output offset voltage than the peak potential of when the differential output amplifier A2 is configured by the ideal operational amplifier. Similarly, the peak potential VnH1 of the negative phase voltage signal represents a potential of the negative phase output terminal when an input voltage to the differential output amplifier A2 is zero. The potential is lower than the bias potential Vob by the output offset voltage. The bottom potential VnL1 of the negative phase voltage signal is also lower by the output offset voltage than the bottom potential of when the differential output amplifier A2 is configured by the ideal operational amplifier.

The relationships among the potentials are shown below:

$$VpH1-VpL1=VnH1-VnL1=\Delta V \qquad (4)$$

$$VpL1 \neq VnH1 \qquad (5)$$

$$VpL1-Vob=-(VnH1-Vob)=\Delta Voff \qquad (6)$$

When quantity of the pulsed communicating laser light LBf and the pulsed monitoring laser light LBm from the laser diode LD are increased, namely, the amplitude of the optical output Pon from the laser diode LD is increased, a potential level of the voltage signal output from the preamplifier section PA is increased. Accordingly, the peak potential VpH1 of the positive phase voltage signal is increased, and the bottom potential VnL1 of the negative phase voltage signal is decreased. Consequently, values on both sides of the equation (4) are increased keeping an equal relationship between the left side and the right side of the equation (4). On the other hand, the bottom potential VpL1 of the positive phase voltage signal and the peak potential VnH1 of the negative phase voltage signal both remain unchanged keeping the relationships of equations (5) and (6). Since an output Vadd1 from the adding circuit ADD coincides with a summation of the peak potential VpH1 of the positive phase voltage signal and the peak potential VnH1 of the negative phase voltage signal, the following equations can be obtained which are obvious from FIG. 5B:

$$VpH1=\Delta V+Vob+\Delta Voff \qquad (7)$$

$$VnH1=Vob-\Delta Voff \qquad (8)$$

$$Vadd1=VpH1+VnH1=\Delta V+2 \times Vob \qquad (9)$$

Next, an operation of the differential output amplifier A2 when the output offset voltage of the differential output amplifier A2 is negative is described with reference to the FIG. 5C. When the differential output amplifier A2 has a negative output offset voltage, the potential of the positive phase voltage signal is lower than that of the negative phase voltage signal during no input to the differential output amplifier A2, namely, during neither the communicating laser light LBf nor the monitoring laser light LBm being emitted from the laser diode LD.

When the laser diode LD emits the pulsed communicating laser light LBf and the pulsed monitoring laser light LBm, the photodiode PD receives the pulsed monitoring laser light LBm and outputs the pulsed light-receiving current signal to the preamplifier section PA. In response to the light-receiving current signal, the differential output amplifier A2 outputs the pulsed positive phase voltage signal having a bottom potential VpL2 and a peak potential VpH2 from the positive phase output terminal, and outputs the pulsed negative phase voltage signal having a bottom potential VnL2 and a peak potential VnH2 from the negative phase output terminal. It should be noted that the bottom potential VpL2 of the positive phase voltage signal represents a potential of the positive phase output terminal when an input voltage to the differential output amplifier A2 is zero. This potential is lower than the bias potential Vob by the output offset voltage. The peak potential VpH2 of the positive phase voltage signal is also lower by the output offset voltage than the peak potential of a case where the differential output amplifier A2 is configured by the ideal operational amplifier. Similarly, the peak potential VnH2 of the negative phase voltage signal represents a potential of the negative phase output terminal when an input voltage to the differential output amplifier A2 is zero. This potential is higher than the bias potential Vob by the output offset voltage. The bottom potential VnL2 of the negative phase voltage signal is also higher by the output offset voltage than the bottom potential of a case where the differential output amplifier A2 is configured by the ideal operational amplifier.

The relationships among the potentials are shown below:

$$VpH2-VpL2=VnH2-VnL2=\Delta V \qquad (10)$$

$$VpL2 \neq VnH2 \qquad (11)$$

$$VpL2-Vob=-(VnH2-Vob)=\Delta Voff \qquad (12)$$

When quantity of the pulsed communicating laser light LBf and the pulsed monitoring laser light LBm from the laser diode LD are increased, namely, the amplitude of the optical output Pon from the laser diode LD is increased, a potential level of the voltage signal output from the preamplifier section PA is increased. Accordingly, the peak potential VpH2 of the positive phase voltage signal is increased, and the bottom potential VnL2 of the negative phase voltage signal is decreased. Consequently, values on both sides of the equation (10) are increased keeping an equal relationship between the left side and the right side of the equation (10). On the other hand, the bottom potential VpL2 of the positive phase voltage signal and the peak potential VnH2 of the negative phase voltage signal both remain unchanged keeping the relationships of equations (11) and (12). Since an output Vadd2 from the adding circuit ADD coincides with a summation of the peak potential VpH2 of the positive phase voltage signal and the peak potential VnH2 of the negative phase voltage signal, the following equations can be obtained which are obvious from the FIG. 5C:

$$VpH2=\Delta V+Vob+\Delta Voff \qquad (13)$$

$$VnH2=Vob-\Delta Voff \qquad (14)$$

$$Vadd2=VpH2+VnH2=\Delta V+2 \times Vob \qquad (15)$$

According to the laser diode driving circuit 101 of this embodiment, the peak potential VpH, VpH1 or VpH2 of the positive phase voltage signal output from the differential output amplifier A2 is held by the first peak hold circuit PH1, and the peak potential VnH, VnH1 or VnH2 of the negative phase voltage signal output from the differential output amplifier A2 is held by the second peak hold circuit PH2.

The adding circuit ADD adds the output signal of the first peak hold circuit PH1 and the output signal of the second peak hold circuit PH2. As clearly shown in equations (3), (9) and (15), the addition results do not relate to the output offset voltage of the differential output amplifier A2. Specifically, the adding circuit ADD outputs the addition result voltage signal based on the optical output Pon from the laser diode LD regardless of the magnitude of the output offset voltage of the differential output amplifier A2.

The reference voltage Vr output from the reference voltage circuit V-REF1 is set up to satisfy the following equation (16) in this embodiment. It should be noted that $\Delta Vp$ in the equation (16) represents an amplitude of the positive phase voltage signal or the negative phase voltage signal output from the differential output amplifier A2 when the intended optical output Pon is output from the laser diode LD.

$$Vr = \Delta Vp + 2 \times Vob \quad (16)$$

The DC current Io is output by the current output circuit IPCONT, which is controlled by the differential input amplifier A3 receiving the reference voltage Vr and the addition result voltage signal output from the adding circuit ADD. The DC current Io output from the current output circuit IPCONT is converted to the pulse current Ip by the operation of the current switch circuit CUR-SW, and then the pulse current Ip is supplied to the laser diode LD. Consequently, the optical output Pon output from the laser diode LD is adjusted to the intended value.

Figure 6:
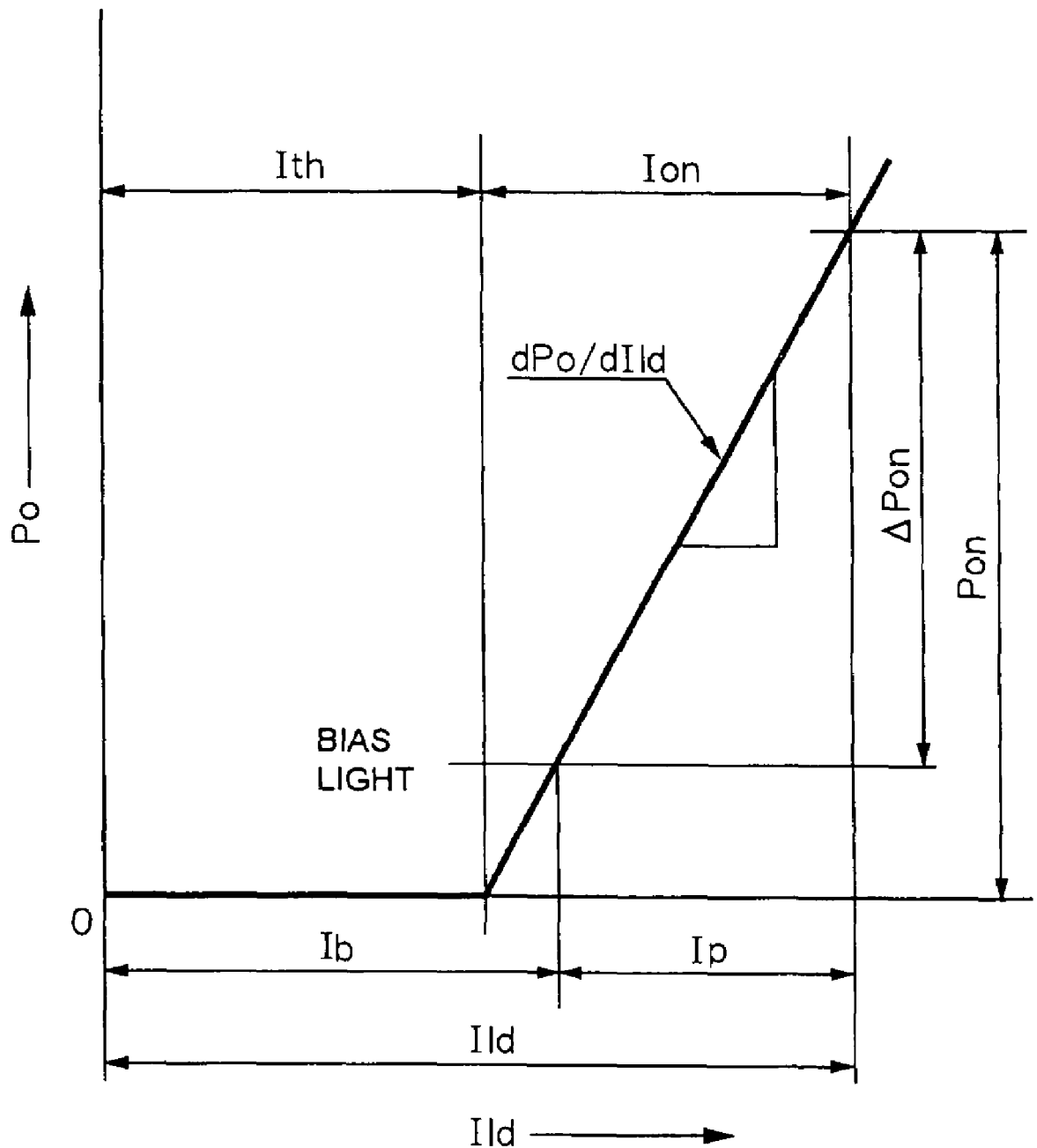
FIG. 6 is a characteristic drawing showing a relationship between the driving current and the optical output of the laser diode when a DC bias current is higher than a light-emitting threshold current.

As shown in FIG. 6, when the DC bias current Ib output from the bias current circuit IB exceeds the light-emitting threshold current Ith, the laser diode LD emits constant light (bias light) even though the laser diode LD is in a state having no transmission data.

Figure 5B:
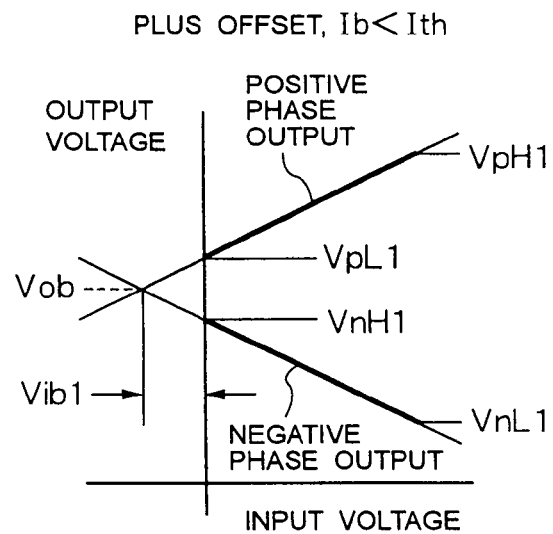
Figure 5C:
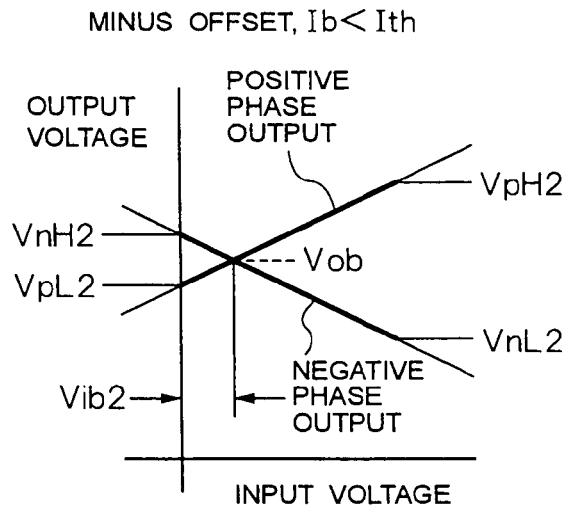
Figure 5D:
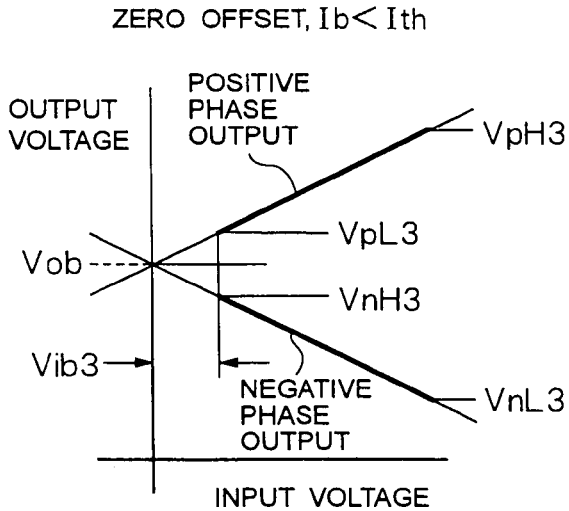

As shown in FIG. 5D, when the bias light is emitted from the laser diode LD, a potential shift is generated in the positive phase voltage signal and the negative phase voltage signal output from the differential output amplifier A2. A level of this shift potential Vib3 corresponds to a power of the bias light emitted from the laser diode LD.

According to the laser diode driving circuit 101 of this embodiment, even though the bias light is emitted from the laser diode LD, the addition result (VpH3+VnH3) by the adding circuit ADD is determined only by the amplitude value ΔV and the bias value Vob as can be understood by the aforementioned equations (3), (9) and (15). Therefore, the addition result is not influenced by the output offset voltage of the differential output amplifier A2 including the offset by the aforementioned bias light. Accordingly, the optical output Pon output from the laser diode LD is adjusted to a value having a constant optical output amplitude (extinction ratio). It should be noted that amount of the potential shift in the positive phase voltage signal and the negative phase voltage signal output from the differential output amplifier A2 is equal to a summation of the shift potential Vib3 and the output offset voltage of the differential output amplifier A2. The shift potential Vib3 results from the magnitude of the DC bias current Ib exceeding the light-emitting threshold current Ith.

The operation of the laser diode driving circuit 101 has been hereinabove described when the capacitor C1, the AC signal amplifier A1 and the capacitor C2 are omitted from the laser diode driving circuit 101, i.e., the preamplifier section PA is directly connected to the differential output amplifier A2. Next, an operation of the laser diode driving circuit 101 (FIG. 2) having the capacitor C1, the AC signal amplifier A1 and the capacitor C2 will be hereinafter described.

It should be noted that when the laser diode driving circuit 101 is provided with the capacitor C1, the AC signal amplifier A1 and the capacitor C2, each peak value of the positive phase voltage signal and the negative phase voltage signal output from the differential output amplifier A2 gently fluctuates depending on fluctuations of an appearance ratio of "1" in a transmitted signal within a period determined by time constants decided by the capacitor C1 and the capacitor C2 and the temperature fluctuation. When each of the hold time constants of the first peak hold circuit PH1 and the second peak hold circuit PH2 is set up to be sufficiently larger than the transmitted pulse width, and also set up to be sufficiently smaller than the time constants decided by the capacitor C1 and the capacitor C2, the first peak hold circuit PH1 and the second peak hold circuit PH2 follow the fluctuations of the peak values of the positive phase voltage signal and the negative phase voltage signal, and therefore, constantly output voltages in accordance with the fluctuated peak values.

When one of the peak values of the first peak hold circuit PH1 and the second peak hold circuit PH2 has a higher value, the other has a lower value by that much. Accordingly, a summation of the peak values corresponds to the amplitude value. Similar relationship holds true when the bottom values are used in the positive phase voltage signal and the negative phase voltage signal output from the differential output amplifier A2. In this instance, a summation of the bottom values corresponds to the amplitude value. However, a tendency of the summed value such as increasing or decreasing as a result of an increase or decrease of the amplitude is reversed depending on a case using the peak value or the bottom value.

As described above, the laser diode driving circuit 101 is not influenced by the output offset voltage of the differential output amplifier A2 even though the laser diode driving circuit 101 is provided with the capacitor C1, the AC signal amplifier A1 and the capacitor C2. The laser diode driving circuit 101 adjusts the optical output Pon output from the laser diode LD so as to have a constant optical output amplitude value.

Figure 7A:
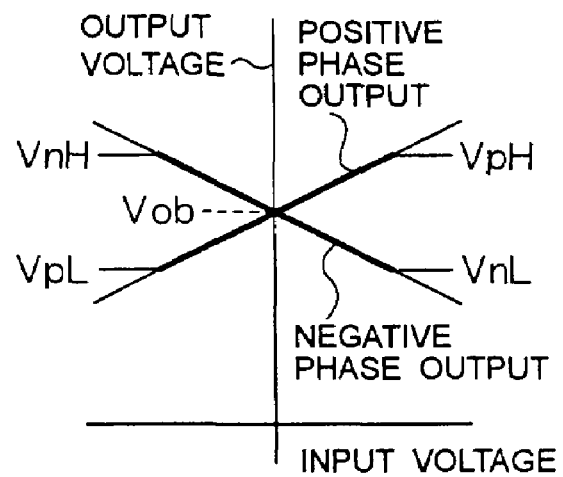
FIGS. 7A to 7C are characteristic drawings each showing a relationship between an input voltage and an output voltage of a differential output amplifier included in the laser diode driving circuit.
Figure 7B:
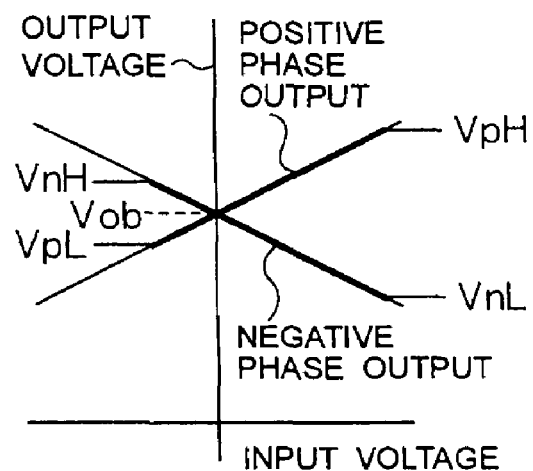
Figure 7C:
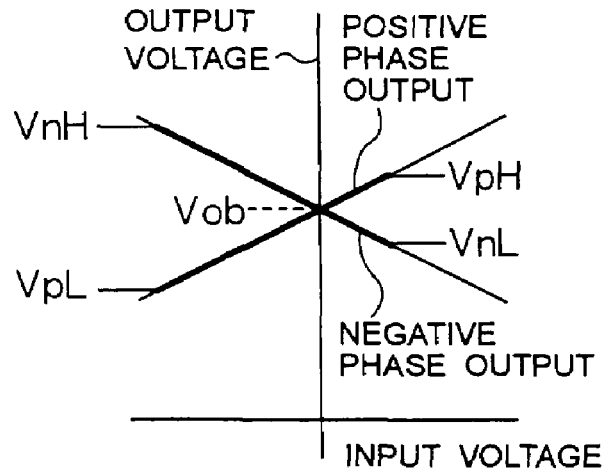

The aforementioned relationship is shown in FIGS. 7A through 7C. FIG. 7A shows an operation of the differential output amplifier A2 when the ratio of the light-emitting time to the non-light-emitting time of the optical output Pon from the laser diode LD is 1:1. FIG. 7B shows an operation of the differential output amplifier A2 when the non-light-emitting time is longer than the light-emitting time of the optical output Pon from the laser diode LD, whereas FIG. 7C shows an operation of the differential output amplifier A2 when the non-light-emitting time is shorter than the light-emitting time. It should be noted that FIGS. 7A, 7B and 7C all show operations of the differential output amplifier A2 when output offset voltages are zero. As can be clearly understood by comparing FIGS. 7A, 7B and 7C with FIGS. 5A, 5B and 5C, an operation of the differential output amplifier A2 during a fluctuation of the ratio of the light-emitting time to the non-light-emitting time of the optical output Pon from the laser diode LD is similar to an operation of when the output offset voltage always slowly fluctuates.

As shown in FIGS. 5A, 5B and 5C, when the laser diode driving circuit 101 is not provided with the capacitor C1, the AC signal amplifier A1 and the capacitor C2, the electrical potential of the positive phase voltage signal output from the differential output amplifier A2 always lies on a line segment having an increasing feature from the bias point (corresponding to the non-input case), and the electrical potential of the negative phase voltage signal always lies on a line segment having a decreasing feature from the bias point (corresponding to the non-input case).

On the other hand, as shown in FIGS. 7A, 7B and 7C, when the laser diode driving circuit 101 is provided with the capacitor C1, the AC signal amplifier A1 and the capacitor C2 between the preamplifier section PA and the differential output amplifier A2, the electrical potentials of the positive phase voltage signal and the negative phase voltage signal respectively lie on line segments each having both increasing and decreasing features. The electrical potential increases and decreases from the bias point. Therefore, an output operating range of the differential output amplifier A2 can be effectively utilized. In order to increase (expand) an output operating range of an amplifier, it is generally necessary to increase the power supply voltage of the amplifier. The laser diode driving circuit 101 of this embodiment can handle an input signal (optical output Pon) having a much wider amplitude while using a lower power supply voltage of the differential output amplifier A2.

When the laser diode driving circuit 101 is not provided with the capacitor C1, the AC signal amplifier A1 and the capacitor C2, a state of the DC bias current Ib having higher current than the light-emitting threshold current Ith causes the electrical shifts in the positive phase voltage signal and the negative phase voltage signal output from the differential output amplifier A2 as mentioned above.

On the other hand, when the laser diode driving circuit 101 is provided with the capacitor C1, the AC signal amplifier A1 and the capacitor C2 between the preamplifier section PA and the differential output amplifier A2, a DC component of the voltage signal of the preamplifier section PA is cut off by the capacitor C1 and the capacitor C2. Accordingly, no potential shift is generated in the positive phase voltage signal and the negative phase voltage signal output from the differential output amplifier A2, which would otherwise result from the DC bias current Ib exceeding the light-emitting threshold current Ith. Consequently, the laser diode driving circuit 101 can handle the input signal (optical output Pon) having a much wider amplitude while using the lower power supply voltage of the differential output amplifier A2.

As described above, the laser diode driving circuit 101 of this embodiment can adjust the amplitude of the optical output Pon output from the laser diode LD to the intended value regardless of the magnitude of the output offset voltage of the differential output amplifier A2.

Further, the amplitude of the optical output Pon output from the laser diode LD can be controlled to an appropriate value even though the DC bias current Ib output from the bias current circuit IB exceeds the light-emitting threshold current Ith.

In addition, according to the laser diode driving circuit 101 of this embodiment, the signal transmitted by the communicating laser light LBf (monitoring laser light LBm) emitted from the laser diode LD can control the laser diode LD even though the signal is consisting of other signals such as the burst signal than the balanced sign.

Furthermore, the laser diode driving circuit 101 of this embodiment is provided with the capacitor C1, the AC signal amplifier A1 and the capacitor C2, and therefore, an effective utilization of the output operating range of the differential output amplifier A2 is realized.

Furthermore, no electrical potential shift is generated in the positive phase voltage signal and the negative phase voltage signal output from the differential output amplifier A2 even though the DC bias current Ib is higher than the light-emitting threshold current Ith. Therefore, the amplitude of the optical output Pon output from the laser diode LD can be kept constant.

As shown in FIG. 2, the laser diode driving circuit 101 of this embodiment controls the driving of the laser diode LD, to which the current switch circuit CUR-SW and the bias current circuit IB are connected at the cathode of the laser diode LD. Alternatively, the laser diode driving control 101 can control the laser diode LD, to which the current switch circuit CUR-SW and the bias current circuit IB are connected at the anode of the laser diode LD.

Furthermore, in the laser diode driving circuit 101 of this embodiment, the cathode of the photodiode PD is connected to the preamplifier section PA. Alternatively, the anode thereof may be connected to the preamplifier section PA.

Figure 8:
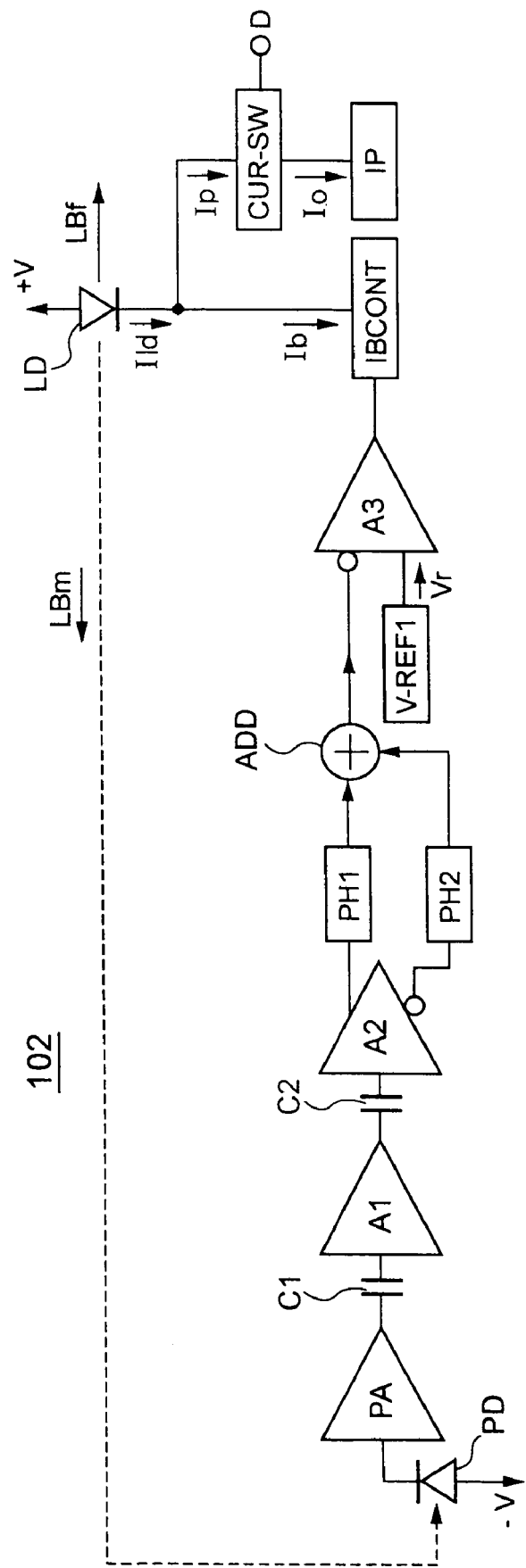
FIG. 8 is a block diagram showing a modified example of the laser diode driving circuit shown in FIG. 2.

A laser diode driving circuit 102 shown in FIG. 8 is a modified example of the laser diode driving circuit 101 of the embodiment shown in FIG. 2. The laser diode driving circuit 102 is modified from the laser diode driving circuit 101 by replacing the current output circuit IPCONT with a current output circuit IP, and by replacing the bias current circuit IB with a bias current circuit IBCONT (bias current output section). In the laser diode driving circuit 102, the current output circuit IP outputs a DC current Io having a constant value. Furthermore, the bias current circuit IBCONT outputs a DC bias current Ib in accordance with an output voltage of the differential input amplifier A3. The laser diode driving circuit 102 achieves the same advantages as the laser diode driving circuit 101.

Figure 9:
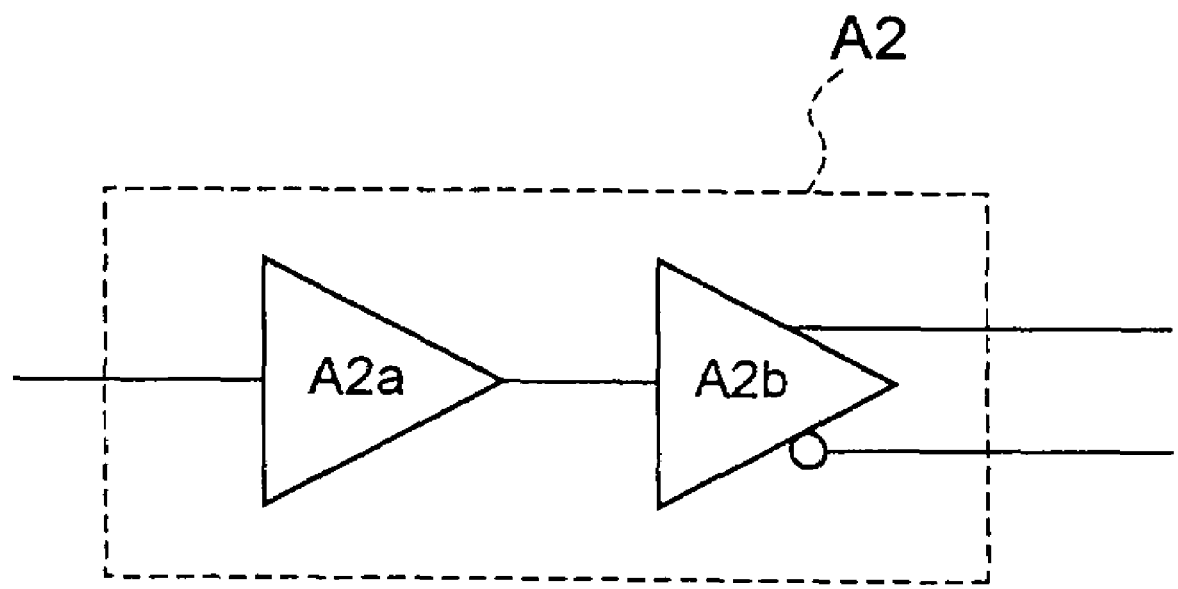
FIG. 9 is a circuit diagram showing an internal structure of the differential output amplifier included in the laser diode driving circuit shown in FIG. 2.

Furthermore, when the differential output amplifier A2 provided within the laser diode driving circuit 101 of this embodiment has a positive phase output and a negative phase output having the same gain gradient with respect to each other, a multistage amplifier configuration may be applied. FIG. 9 shows an example of the multistage amplifier including two amplifiers, that is, an amplifier A2*a* and a differential output amplifier A2*b*. In a similar manner, the AC signal amplifier A1 may have a multistage amplifier configuration.

Second Embodiment

Figure 10:
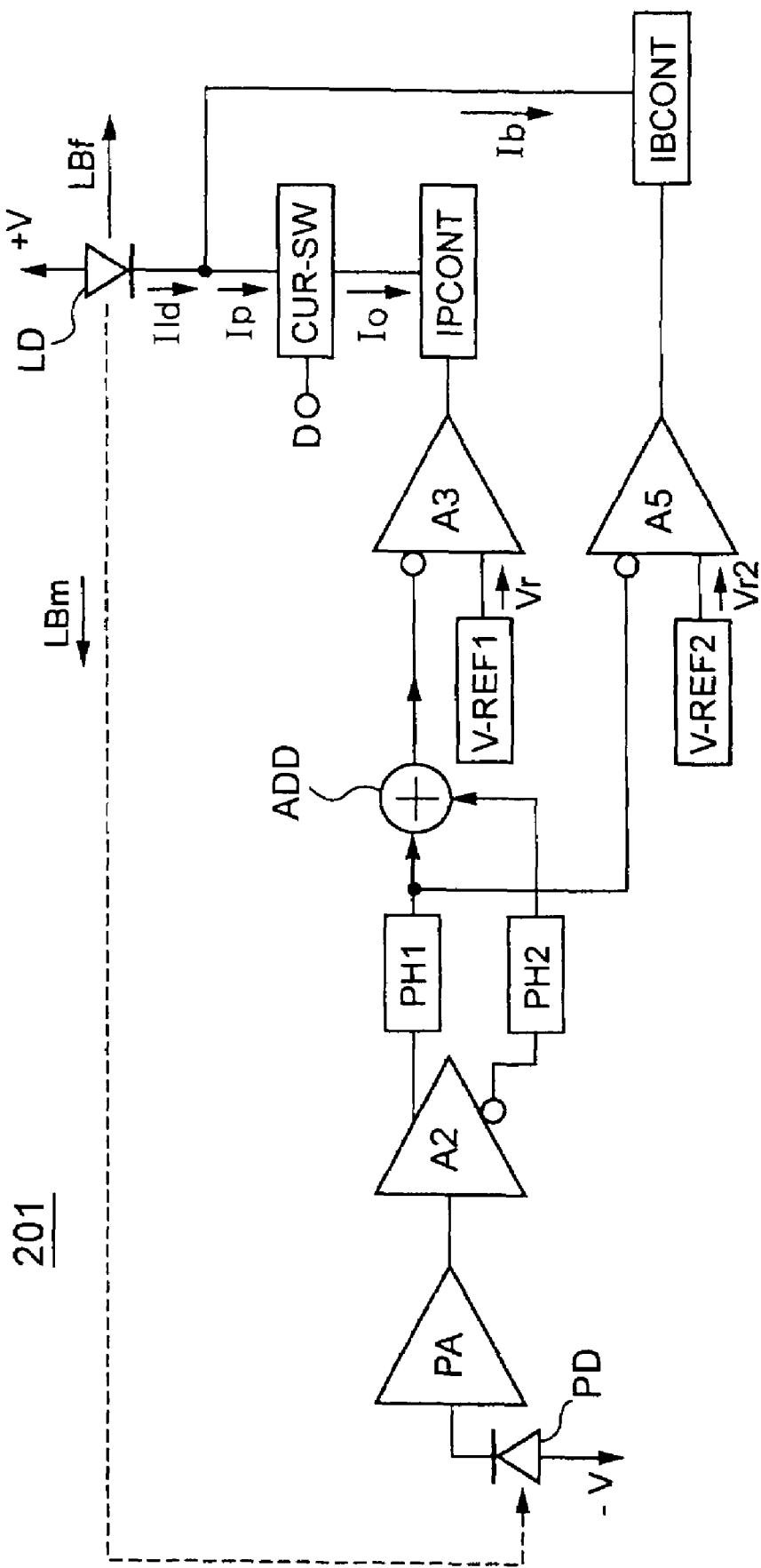
FIG. 10 is a block diagram showing a structure of a laser diode driving circuit according to a second embodiment of the present invention.

A laser diode driving circuit (a driving apparatus of a light-emitting device) 201 according to a second embodiment of the present invention is shown in FIG. 10.

As compared with the laser diode driving circuit 101 of the first embodiment shown in FIG. 2, the laser diode driving circuit 201 has such a configuration that a bias current circuit IBCONT is provided in place of the bias current circuit IB and a second differential input amplifier A5 and a second reference voltage circuit V-REF2 are added. The second differential input amplifier A5 forms a second calculation section of the present invention.

The second differential input amplifier A5 amplifies and outputs a voltage difference between a second reference voltage Vr2 output from the second reference voltage circuit V-REF2 and an output signal of the first peak hold circuit PH1.

The bias current circuit IBCONT outputs a DC bias current Ib based on an output voltage from the second differential input amplifier A5. For example, when the output voltage from the second differential input amplifier A5 increases, the bias current circuit IBCONT increases the DC bias current Ib. Reversely, when the output voltage from the second differential input amplifier A5 decreases, the bias current circuit IBCONT decreases the DC bias current Ib.

Next, an operation of the laser diode driving circuit 201 of this embodiment is described.

With respect to current control of the DC current Io output from the current output circuit IPCONT (a pulse current Ip output from the current switch circuit CUR-SW), the laser diode driving circuit 201 has substantially the same function as the laser diode driving circuit 101 of the first embodiment. Therefore, current control of the DC bias current Ib output from the bias current circuit IBCONT will be mainly described hereinbelow.

A first peak hold circuit PH1 included in the laser diode driving circuit 201 of this embodiment holds peak potentials VpH, VpH1, VpH2 and VpH3 (FIGS. 5A-5D) of the positive phase voltage signal output from the differential output amplifier A2. These peak potentials VpH, VpH1, VpH2 and VpH3 correspond to the peak values of the optical output Pon from the laser diode LD.

When the electrical potential of the output signal from the first peak hold circuit PH1 (peak potentials VpH, VpH1, VpH2 and VpH3 of the positive phase voltage signal) is higher than the second reference voltage Vr2 output from the second reference voltage circuit V-REF2, the second differential input amplifier A5 controls the bias current circuit IBCONT so as to decrease the DC bias current Ib supplied to the laser diode LD.

In this instance, the second reference voltage Vr2 output from the second reference voltage circuit V-REF2 is set to be higher than the reference voltage Vr output from the reference voltage circuit V-REF1. It is preferable to adjust the difference between the second reference voltage Vr2 and the reference voltage Vr to the expected maximum value of the output offset voltage of the differential output amplifier A2. Consequently, the DC bias current Ib having an extremely close value to the light-emitting threshold current Ith can be constantly supplied to the laser diode LD, thereby keeping the peak value of the optical output Pon from the laser diode LD at a predetermined value.

As described above, the laser diode driving circuit 201 of this embodiment concurrently carries out the current control of the pulse current Ip (DC current Io) for keeping the amplitude of the optical output Pon from the laser diode LD at a predetermined value, and the current control of the DC bias current Ib for keeping the peak value of the optical output Pon at a predetermined value.

Figure 11:
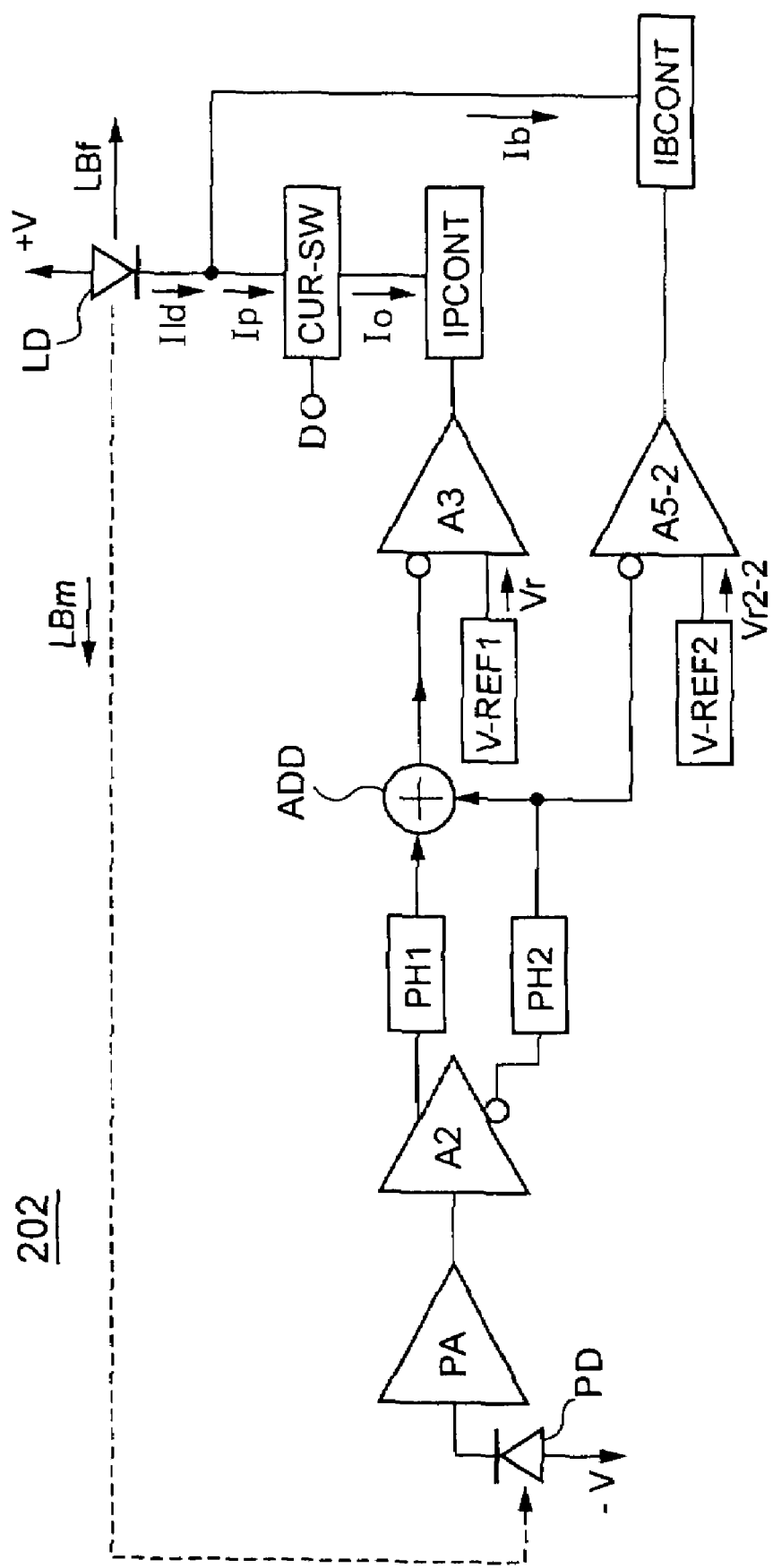
FIG. 11 is a block diagram showing a modified example of the laser diode driving circuit shown in FIG. 10.

A laser diode driving circuit 202 shown in FIG. 11 is a modified example of the laser diode driving circuit 201 of this embodiment shown in FIG. 10. As compared with the laser diode driving circuit 201, the laser diode driving circuit 202 has such a configuration that a second differential input amplifier A5-2 is provided in place of the second differential input amplifier A5, a second reference voltage circuit V-REF2-2 is provided in place of the second reference voltage circuit V-REF2, and input polarities of the second differential input amplifier A5-2 are inverted.

The second differential input amplifier A5-2 amplifies and outputs a voltage difference between a second reference voltage Vr2-2 output from the second reference voltage circuit V-REF2-2 and an output signal of the second peak hold circuit PH2.

The bias current circuit IBCONT outputs a DC bias current Ib based on an output voltage from the second differential input amplifier A5-2. For example, when the output voltage from the second differential input amplifier A5-2 increases, the bias current circuit IBCONT decreases the DC bias current Ib. Reversely, when the output voltage from the second differential input amplifier A5-2 decreases, the bias current circuit IBCONT increases the DC bias current Ib.

Next, an operation of the laser diode driving circuit 202 is described.

With respect to the current control of the DC current Io output from the current output circuit IPCONT (a pulse current Ip output from the current switch circuit CUR-SW), the laser diode driving circuit 202 has substantially the same function as the laser diode driving circuit 101 of the first embodiment. Therefore, the current control of the DC bias current Ib output from the bias current circuit IBCONT will be mainly described hereinbelow.

The second peak hold circuit PH2 included in the laser diode driving circuit 202 holds peak potentials VnH, VnH1, VnH2 and VnH3 (FIGS. 5A-5D) of the negative phase voltage signal output from the differential output amplifier A2. These peak potentials VnH, VnH1, VnH2 and VnH3 correspond to the bottom values of the optical output Pon from the laser diode LD.

When the electrical potential of the output signal from the second peak hold circuit PH2 (peak potentials VnH, VnH1, VnH2 and VnH3 of the negative phase voltage signal) is lower than the second reference voltage Vr2-2 output from the second reference voltage circuit V-REF2-2, the second differential input amplifier A5-2 controls the bias current circuit IBCONT so as to decrease the DC bias current Ib supplied to the laser diode LD.

In this instance, the second reference voltage Vr2-2 output from the second reference voltage circuit V-REF2-2 is set to be lower than the bias voltage Vob of the differential output amplifier A2. It is preferable to adjust the difference between the second reference voltage Vr2-2 and the bias voltage Vob to the expected maximum value of the output offset voltage of the differential output amplifier A2. Consequently, the DC bias current Ib having an extremely close value to the light-emitting threshold current Ith can be constantly supplied to the laser diode LD, thereby keeping the bottom value of the optical output Pon from the laser diode LD at the predetermined value.

As described above, the laser diode driving circuit 202 concurrently carries out the current control of the pulse current Ip (DC current Io) for keeping the amplitude of the optical output Pon from the laser diode LD at a predetermined value, and the current control of the DC bias current Ib for keeping the bottom value of the optical output Pon at a predetermined value.

Figure 12A:
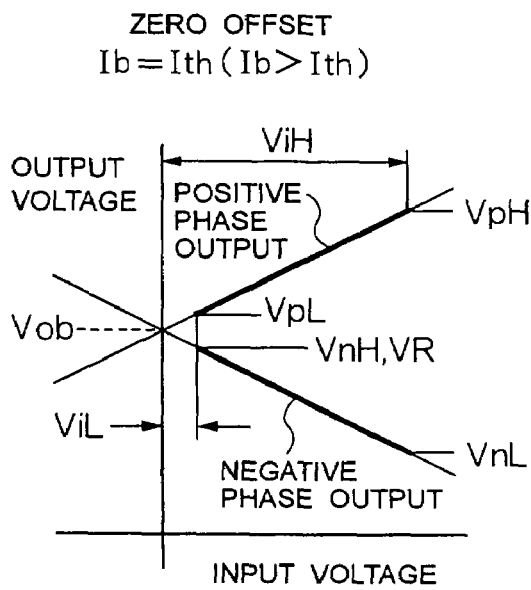
FIGS. 12A to 12D are characteristic drawings each showing a relationship between an input voltage and an output voltage of a differential output amplifier included in the laser diode driving circuit shown in FIG. 11.
Figure 12B:
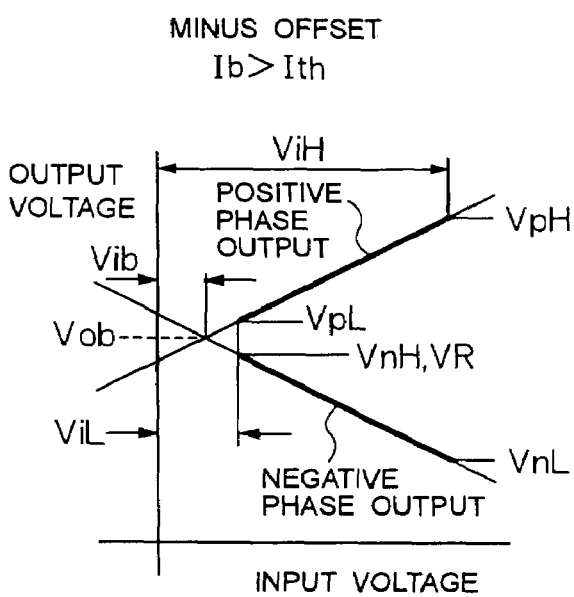
Figure 12C:
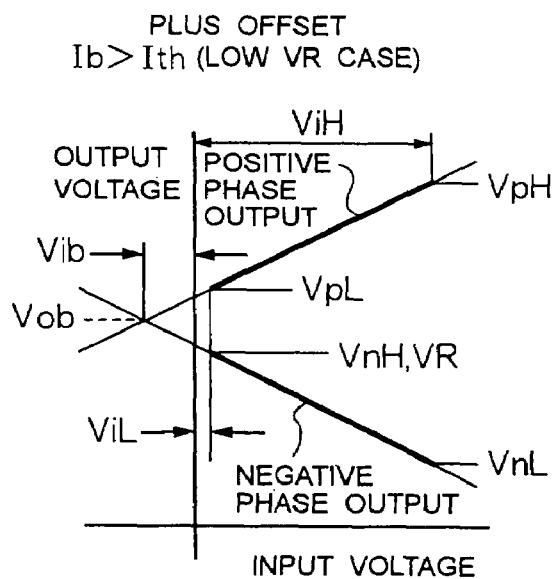
Figure 12D:
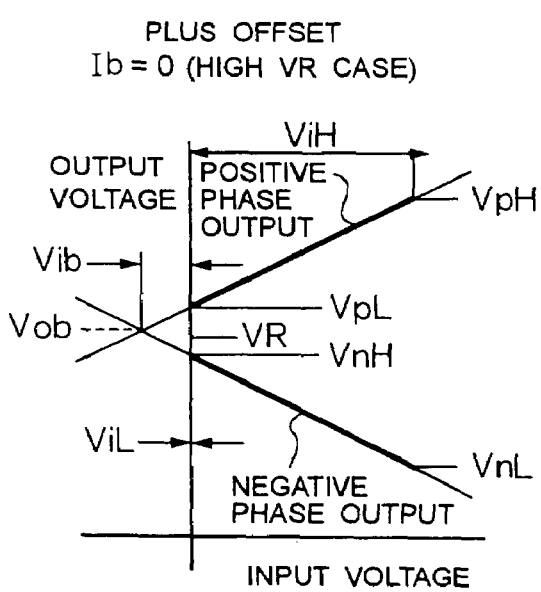

Operations of the differential output amplifier A2 during the bottom value control of the optical output Pon from the laser diode LD by the laser diode driving circuit 202 are shown in FIGS. 12A to 12D. FIG. 12A shows an input-output characteristic of the differential output amplifier A2 when the output offset voltage of the differential output amplifier A2 is zero. FIG. 12B shows an input-output characteristic of the differential output amplifier A2 when the output offset voltage of the differential output amplifier A2 is below zero. FIGS. 12C and 12D show input-output characteristics of the differential output amplifier A2 when the output offset voltages of the differential output amplifier A2 are above zero. When the second reference voltage Vr2-2 is set to an electrical potential VR shown in FIG. 12C, the DC bias current Ib is kept so as to ensure the differential input voltage ViL.

As described above, the laser diode driving circuits 201 and 202 of this embodiment not only achieve the same advantages as the laser diode driving circuits 101 and 102 of the first embodiment, but also achieve the following advantages.

The light-emitting threshold current Ith of the laser diode LD varies depending on a power source fluctuation, a temperature fluctuation, or a piece-to-piece variation of the laser diodes LD. In this connection, the laser diode driving circuits 201 and 202 of this embodiment maintain the DC bias current Ib at an extremely close value to the light-emitting threshold current Ith (a value slightly higher than the light-emitting threshold current Ith). Therefore, the amplitude of the optical output Pon from the laser diode LD as well as the peak value or the bottom value can be kept at predetermined values.

Consequently, the laser diode LD is maintained at one of the light-emitting states, i.e., either a strong light-emitting state (corresponding to a transmission signal "1") or a weak light-emitting state (corresponding to a transmission signal "0"). Therefore, transition of the transmission signal from "1" to "0" and from "0" to "1" can be speeded up. Furthermore, the transition speed can be evenly leveled.

Third Embodiment

Figure 13:
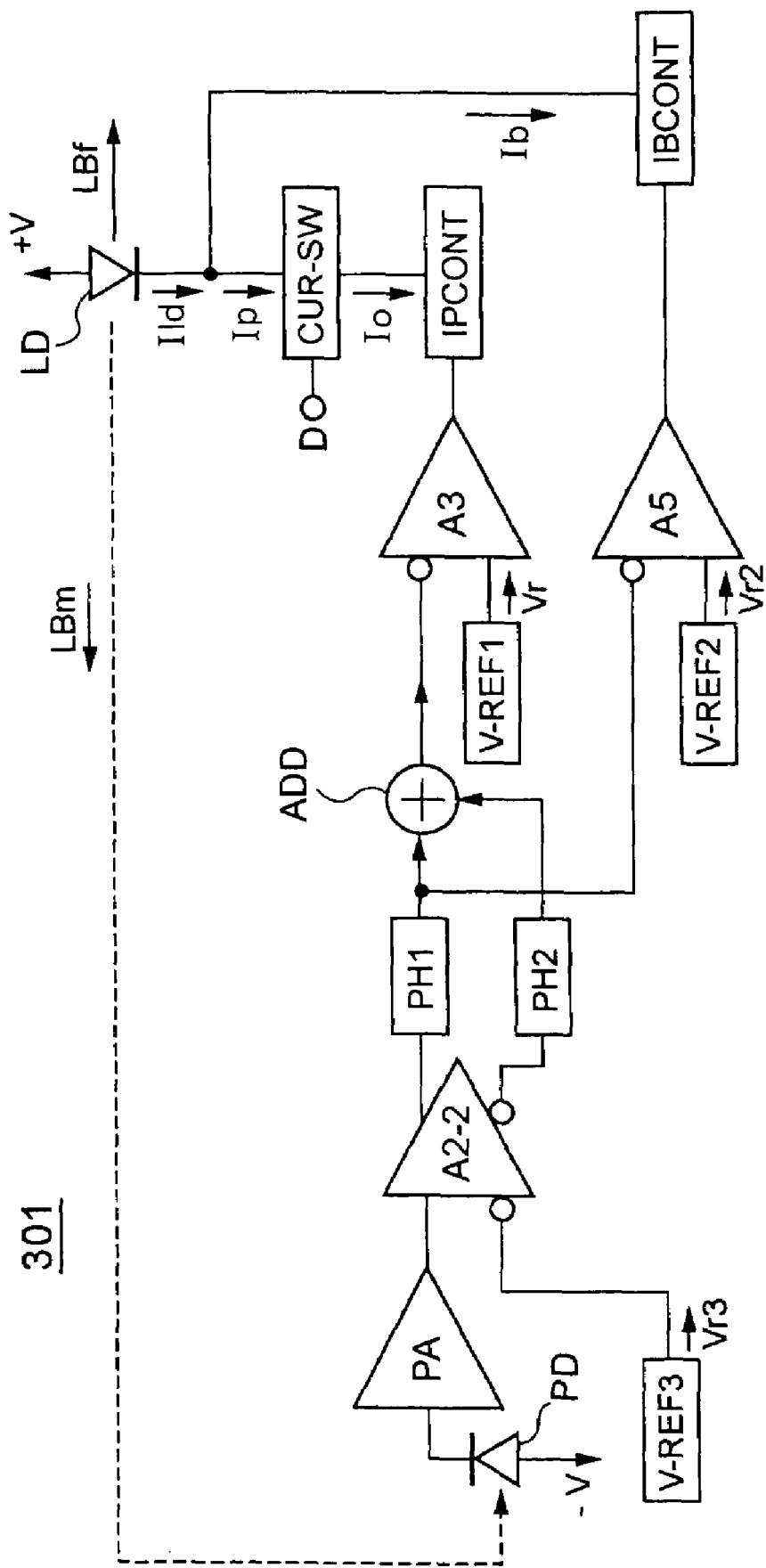
FIG. 13 is a block diagram showing a structure of a laser diode driving circuit according to a third embodiment of the present invention.

A laser diode driving circuit (a driving apparatus of a light-emitting device) 301 according to a third embodiment of the present invention is shown in FIG. 13.

As compared with the laser diode driving circuit 201 of the second embodiment shown in FIG. 10, the laser diode driving circuit 301 has such a configuration that a differential input-output amplifier A2-2 is provided in place of the differential output amplifier A2 and a third reference voltage circuit V-REF3 is added.

A third reference voltage Vr3 output from the third reference voltage circuit V-REF3 is adjusted so as to coincide with an electrical potential of a voltage signal output from the preamplifier section PA on the condition that no input is supplied to the preamplifier section PA. The temperature fluctuation or the power supply fluctuation are included in the above condition. The third reference voltage circuit V-REF3 may be configured by using, for example, a circuit similar to the preamplifier section PA if the circuit has an open input.

A positive phase input terminal of the differential input-output amplifier A2-2 is connected to an output terminal of the preamplifier section PA, and a negative phase input terminal of the differential input-output amplifier A2-2 is connected to an output terminal of the third reference voltage circuit V-REF3. A positive phase output terminal of the differential input-output amplifier A2-2 is connected to an input terminal of the first peak hold circuit PH1, and a negative phase output terminal of the differential input-output amplifier A2-2 is connected to an input terminal of the second peak hold circuit PH2. The differential input-output amplifier A2-2 amplifies a voltage difference between an electrical potential of a voltage signal output from the preamplifier section PA and the second reference voltage Vr2 output from the third reference voltage circuit V-REF3 in a plus direction and a minus direction on the basis ob the bias voltage. The amplified result in the plus direction is output from the positive phase output terminal as a positive phase voltage signal and the amplified result in the minus direction is output from the negative phase output terminal as a negative phase voltage signal The first peak hold circuit PH1 holds a peak potential of the positive phase voltage signal output from the differential input-output amplifier A2-2, and the second peak hold circuit PH2 holds a peak potential of the negative phase voltage signal output from the differential input-output amplifier A2-2.

When the power source fluctuation or the ambient temperature fluctuation occurs, there is concern that the output bias voltage of the preamplifier section PA may fluctuate. In the laser diode driving circuit 201 of the second embodiment, the fluctuation of the output bias voltage of the preamplifier section PA leads to a fluctuation of the output offset voltage of the differential output amplifier A2. When the fluctuation of the output offset voltage of the differential output amplifier A2 is large, control of the DC bias current Ib for keeping the constant peak value (or the constant bottom value) of the optical output Pon from the laser diode LD becomes unstable. Accordingly, there may be cases where the DC bias current Ib decreases to zero, or far exceeds the light-emitting threshold current Ith.

In this connection, the differential input-output amplifier A2-2 included in the laser diode driving circuit 301 of this embodiment amplifies a voltage difference between an electrical potential of a voltage signal output from the preamplifier section PA and the second reference voltage Vr2 output from the third reference voltage circuit V-REF3. Therefore, the fluctuation of the output offset voltage of the differential input-output amplifier A2-2 can be kept small even though the output bias voltage of the preamplifier section PA fluctuates.

As described above, the laser diode driving circuit 301 of this embodiment not only achieves the same advantages as the laser diode driving circuit 201 of the second embodiment, but also achieves the following advantages.

The fluctuation of the output offset voltage of the differential input-output amplifier A2-2 can be kept small, which permits stable control over the DC bias current Ib.

It should be noted that the differential input-output amplifier A2-2 and the third reference voltage circuit V-REF3 included in the laser diode driving circuit 301 of this embodiment can be incorporated into the laser diode driving circuit 202 shown in FIG. 11. Specifically, the differential output amplifier A2 may be replaced with the differential input-output amplifier A2-2, and the third reference voltage circuit V-REF3 may be added.

Fourth Embodiment

Figure 14:
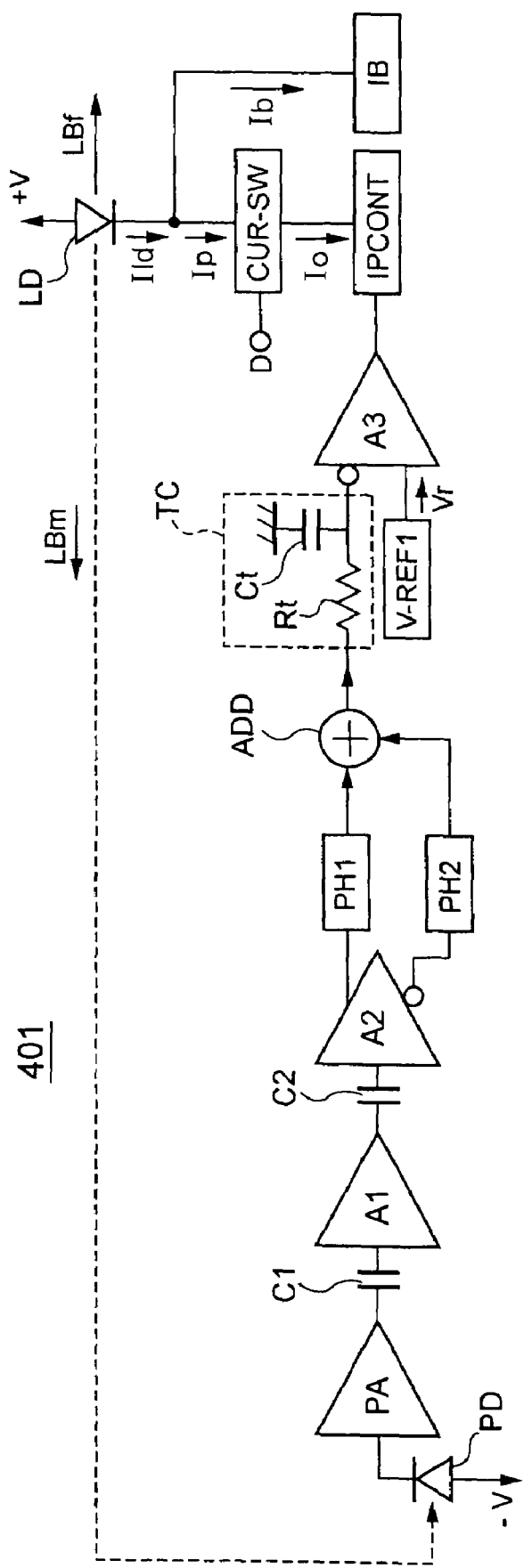
FIG. 14 is a block diagram showing a structure of a laser diode driving circuit according to a fourth embodiment of the present invention.

A laser diode driving circuit (a driving apparatus of a light-emitting device) 401 according to a fourth embodiment of the present invention is shown in FIG. 14.

As compared with the laser diode driving circuit 101 of the first embodiment shown in FIG. 2, the laser diode driving circuit 401 has such a configuration that a time constant circuit TC (a first time constant circuit) is added.

The time constant circuit TC includes a resistance Rt and a capacitor Ct. The resistance Rt is connected in series between the output terminal of the adding circuit ADD and the negative phase input terminal of the differential input amplifier A3. The capacitor Ct is connected in series between the grounding line and the negative phase input terminal of the differential input amplifier A3.

In general, signal transmitting routes have different transmission delay times, respectively. In addition, circuits such as amplifiers have different response speeds. Accordingly, when a loop response of a control system is of a high order such as second order or above, the control may be unstable and may cause an oscillation.

In this connection, the laser diode driving circuit 401 includes the time constant circuit TC within the control system, and thus no oscillation occurs. Accordingly, the laser diode driving circuit 401 permits stable control over the optical output Pon from the laser diode LD.

Although the time constant circuit TC is provided between the output terminal of the adding circuit ADD and the negative phase input terminal of the differential input amplifier A3 in the laser diode driving circuit 401 shown in FIG. 14, the position of the time constant circuit TC can be at any location on the control route of the current output circuit IPCONT. For example, the time constant circuit TC may be connected to the output terminal of the differential input amplifier A3. When the laser diode driving circuit has a circuit configuration for controlling the bias current circuit IBCONT as in the laser diode driving circuit 301 of the third embodiment shown in FIG. 13, providing the time constant circuit on a control route of the bias current circuit IBCONT stabilizes the control of the bias current circuit IBCONT.

Figure 15:
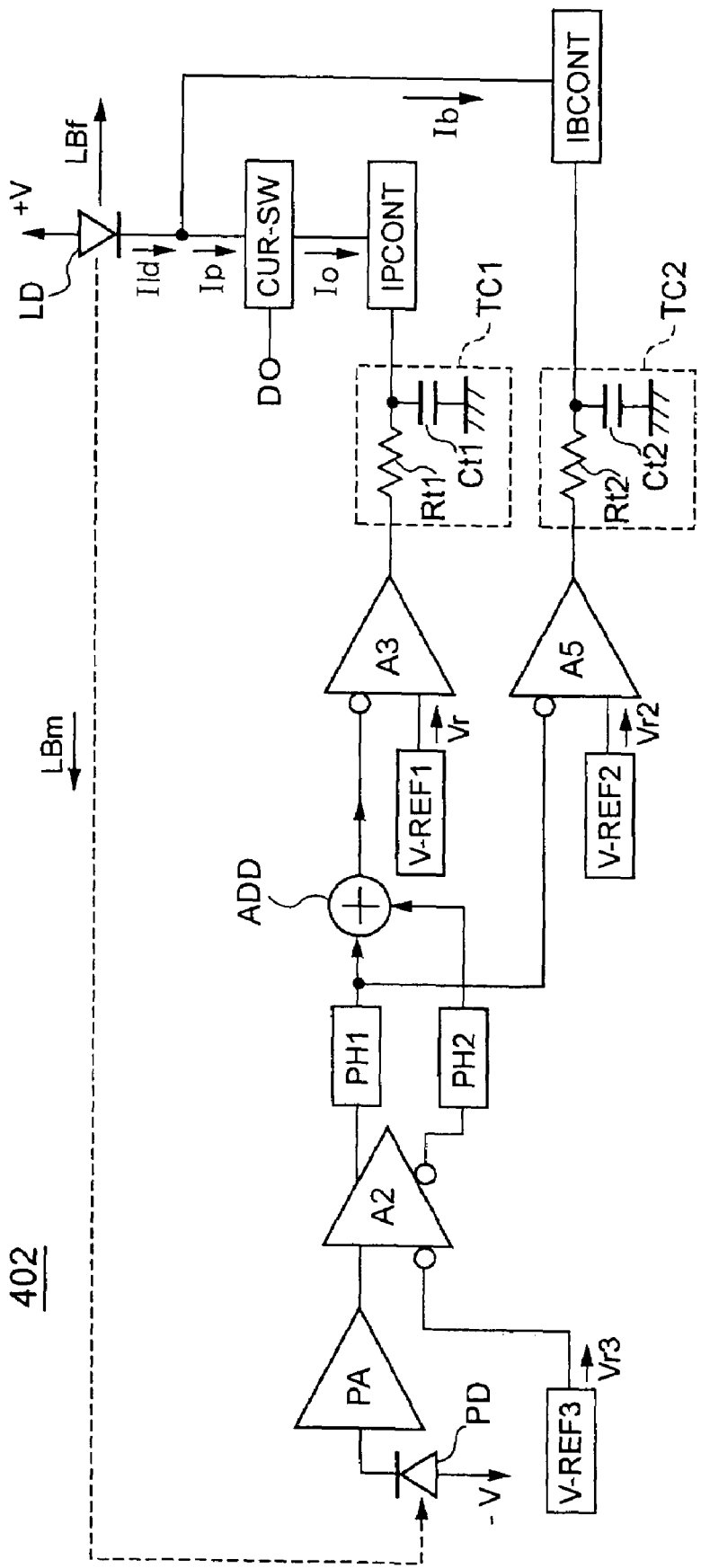
FIG. 15 is a block diagram showing a modified example of the laser diode driving circuit shown in FIG. 14.

The laser diode driving circuit 402 is shown in FIG. 15, which has such a configuration that a time constant circuit TC1 (a first time constant circuit) and a time constant circuit TC2 (a second time constant circuit) are added as compared with the laser diode driving circuit 301 shown in FIG. 13.

The time constant circuit TC1 includes a resistance Rt1 and a capacitor Ct1. The resistance Rt1 is connected in series between the output terminal of the differential input amplifier A3 and the input terminal of the current output circuit IPCONT. The capacitor Ct1 is connected in series between the grounding line and the input terminal of the current output circuit IPCONT.

The time constant circuit TC2 includes a resistance Rt2 and a capacitor Ct2. The resistance Rt2 is connected in series between the output terminal of the second differential input amplifier A5 and the input terminal of the bias current circuit IBCONT. The capacitor Ct2 is connected in series between the grounding line and the input terminal of the bias current circuit IBCONT.

The laser diode driving circuit 402 achieves stabilized control over the current output circuit IPCONT and stabilized control over the bias current circuit IBCONT.

Providing individual time constant circuits within a control route of the current output circuit IPCONT and a control route of the bias current circuit IBCONT can give priority to the control on either one of the current output circuit IPCONT or the bias current circuit IBCONT. For example, when a time constant of the time constant circuit CT2 is set to be sufficiently higher than that of the time constant circuit CT1 in the laser diode driving circuit 402, the control of the current output circuit IPCONT has a priority over the control of the bias current circuit IBCONT.

As described above, the laser diode driving circuits of this embodiment not only obtain the same advantages as those of the first through third embodiments, but also obtain much more stabilized control over the optical output Pon from the laser diode LD. Moreover, a priority of the control on either the current output circuit IPCONT or the bias current circuit IBCONT can be arbitrarily set.

Fifth Embodiment

Figure 16:
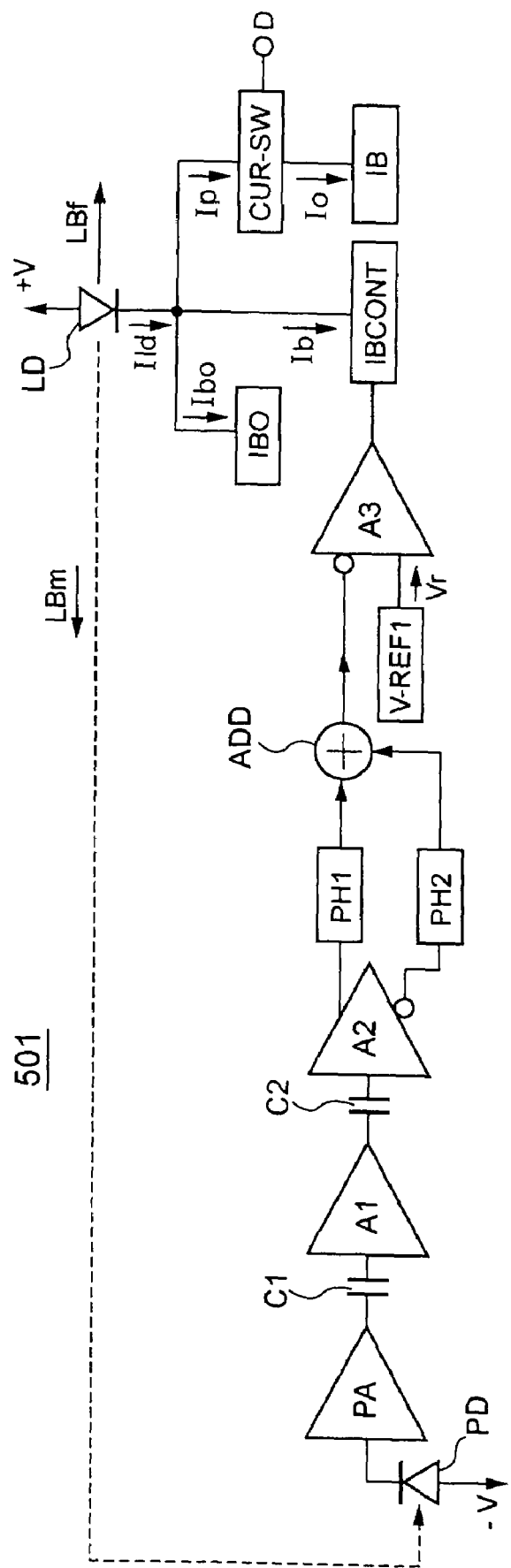
FIG. 16 is a block diagram showing a structure of a laser diode driving circuit according to a fifth embodiment of the present invention.

A laser diode driving circuit (a driving apparatus of a light-emitting device) 501 according to a fifth embodiment of the present invention is shown in FIG. 16.

As compared with the laser diode driving circuit 102 shown in FIG. 8, the laser diode driving circuit 501 has such a configuration that a second bias current circuit IBO (a second bias current output section) is added.

An output terminal of the second bias current circuit IBO which outputs a second DC bias current Ib0 is connected to the cathode of the laser diode LD. The second DC bias current Ib0 does not need to be a constant current. Therefore, the second bias current circuit IBO can be configured by a resistance which is connected between the cathode of the laser diode LD and the power source.

For example, when a fluctuation such as a piece-to-piece variation, a power source fluctuation, or a temperature fluctuation occurs in the laser diode driving circuit 102 shown in FIG. 8, the DC current Io output from the current output circuit IP and the DC bias current Ib output from the bias current circuit IBCONT may both change. There is concern that the DC current Io may increase and the DC bias current Ib may decrease, and in some cases, the DC bias current Ib may be zero. An input-output characteristic of the differential output amplifier A2 under the above condition is shown in 12D.

When the bias current Ib is zero, a light-emitting start timing of the laser diode LD is delayed, a light-extinction start timing is made earlier, and a pulse waveform of the communicating laser light LBf emitted by the laser diode LD is degraded, which lead to a transmission error of a signal.

In this connection, the laser diode driving circuit 501 of this embodiment includes the second bias current circuit IBO. Therefore, even though the DC bias current Ib output from the bias current circuit IBCONT decreases to zero, the second DC bias current Ibo flows through the laser diode LD as a bias current. Consequently, the degradation of the light-emitting pulse waveform of the laser diode LD can be suppressed to the minimum.

Furthermore, when the laser diode driving circuit 501 is configured as an integrated circuit, provision of the second bias current circuit IBO at the external of the integrated circuit decreases the power consumption of the integrated circuit portion.

Figure 17:
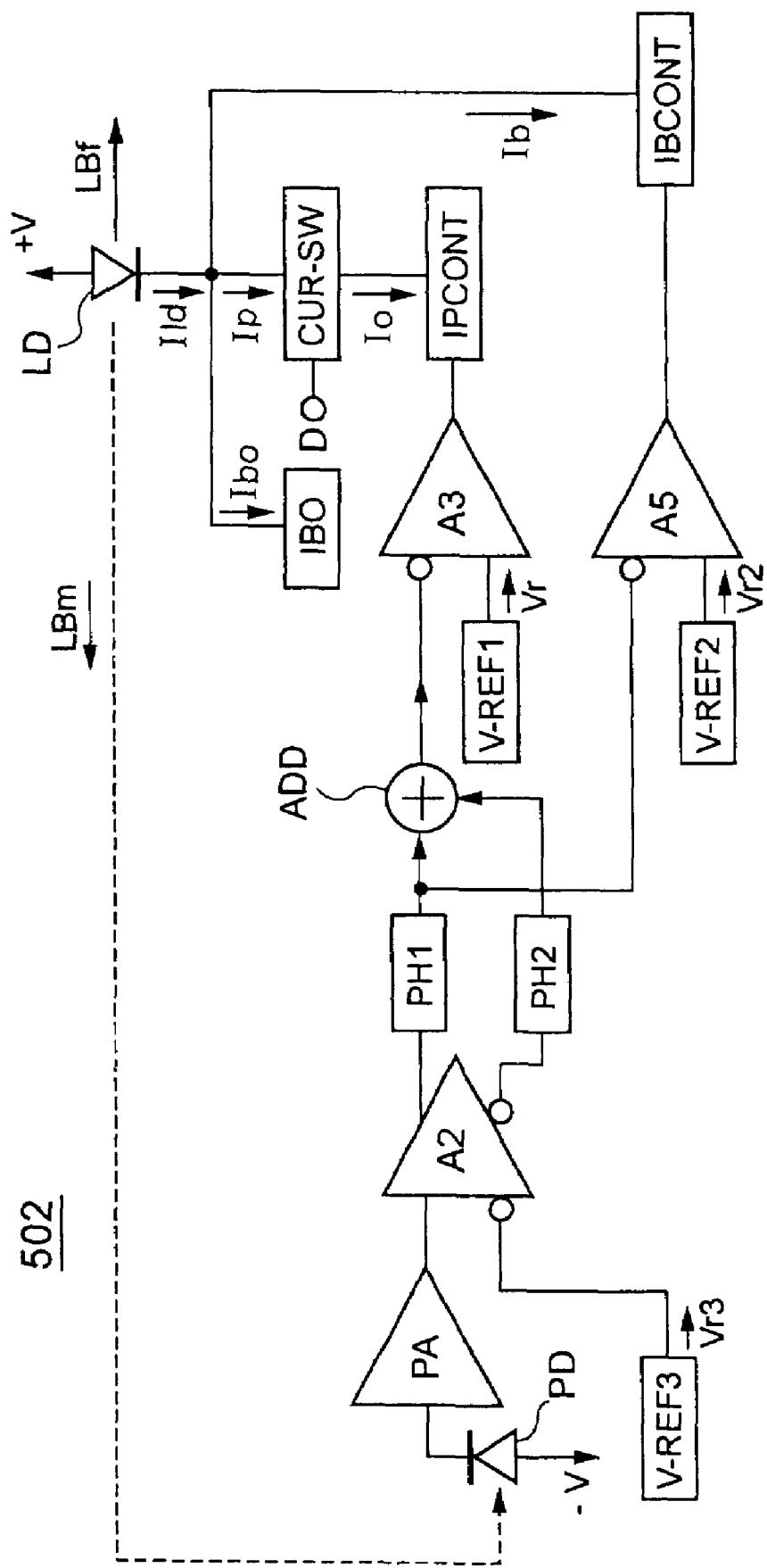
FIG. 17 is a block diagram showing a modified example of the laser diode driving circuit shown in FIG. 16.

It should be noted that the second bias current circuit IBO may be added to the laser diode driving circuit 301 of the third embodiment shown in FIG. 13. The laser diode driving circuit 502 having such configuration is shown in FIG. 17.

As described above, the laser diode driving circuit 501 and the laser diode driving circuit 502 of this embodiment not only obtain the same advantages as those of the first through fourth embodiments, but also suppress the degradation of the light-emitting pulse waveform of the laser diode LD to the minimum. Moreover, when the laser diode driving circuit is configured as the integrated circuit, the power consumption of the integrated circuit portion can be reduced.

Sixth Embodiment

Figure 18:
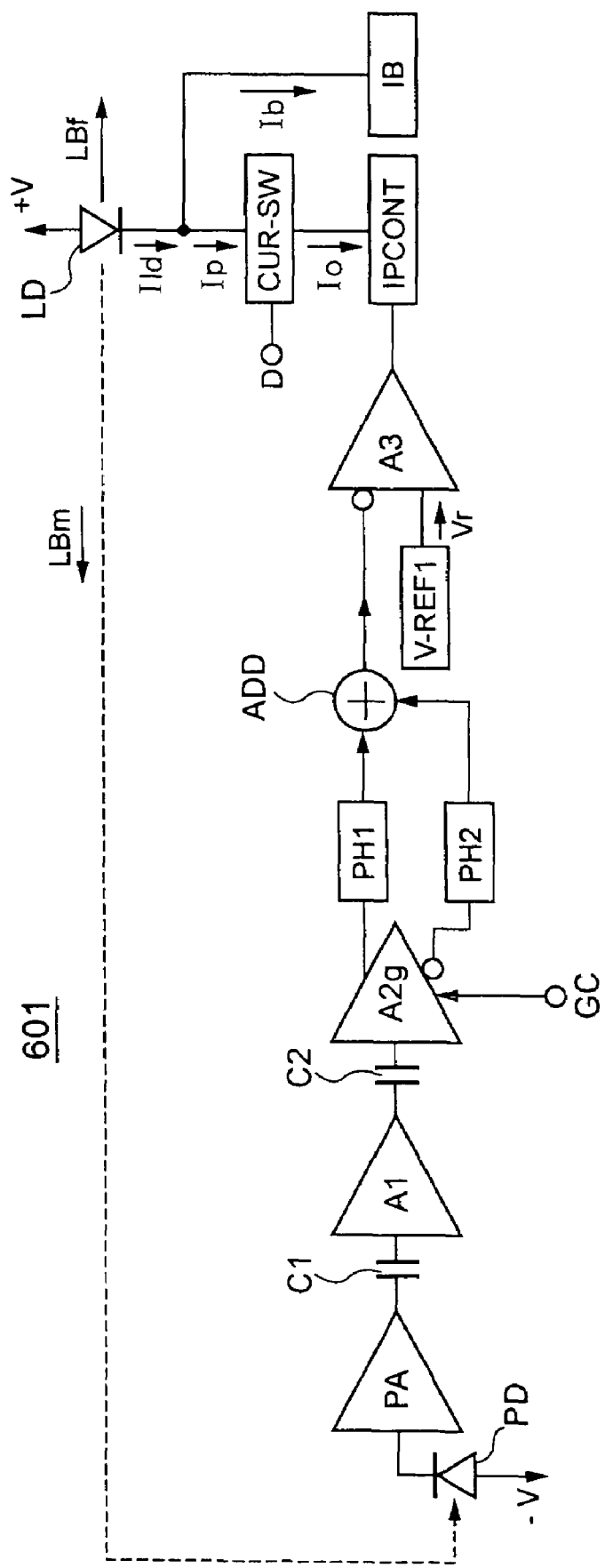
FIG. 18 is a block diagram showing a structure of a laser diode driving circuit according to a sixth embodiment of the present invention.

A laser diode driving circuit (a driving apparatus of a light-emitting device) 601 according to a sixth embodiment of the present invention is shown in FIG. 18.

As compared with the laser diode driving circuit 101 shown in FIG. 2, the laser diode driving circuit 601 has such a configuration that a differential output amplifier with the gain control terminal, A2g, is provided in place of the differential output amplifier A2. A gain of the differential output amplifier with the gain control terminal A2g is adjustable by a gain control signal GC.

There is concern that the level of the voltage signal output from the preamplifier section PA fluctuates depending on a light-emitting efficiency of the photodiode PD or a characteristic of the optical feedback loop between the laser diode LD and the photodiode PD even though the optical output Pon from the laser diode LD is constant.

In this connection, the gain is adjustable in the differential output amplifier with the gain control terminal A2g included in the laser diode driving circuit 601 of this embodiment, and thus each level of the positive phase voltage signal and the negative phase voltage signal output from the differential output amplifier having the gain control terminal A2g can be kept at constant even though the voltage signal level output from the preamplifier section PA fluctuates.

It should be noted that replacing the preamplifier section PA and the AC signal amplifier A1 with gain adjustable types is effective from the viewpoint of keeping the positive phase voltage signal supplied to the first peak hold circuit PH1 and the negative phase voltage signal supplied to the second peak hold circuit PH2 constant.

As described above, the laser diode driving circuit 601 of this embodiment not only obtains the same advantages as those of the first through fifth embodiments, but also constantly supplies the positive phase voltage signal having the constant level and the negative phase voltage signal having the constant level to the first peak hold circuit PH1 and the second peak hold circuit PH2, respectively on condition that the optical output Pon from the laser diode LD is constant.

Seventh Embodiment

Figure 19:
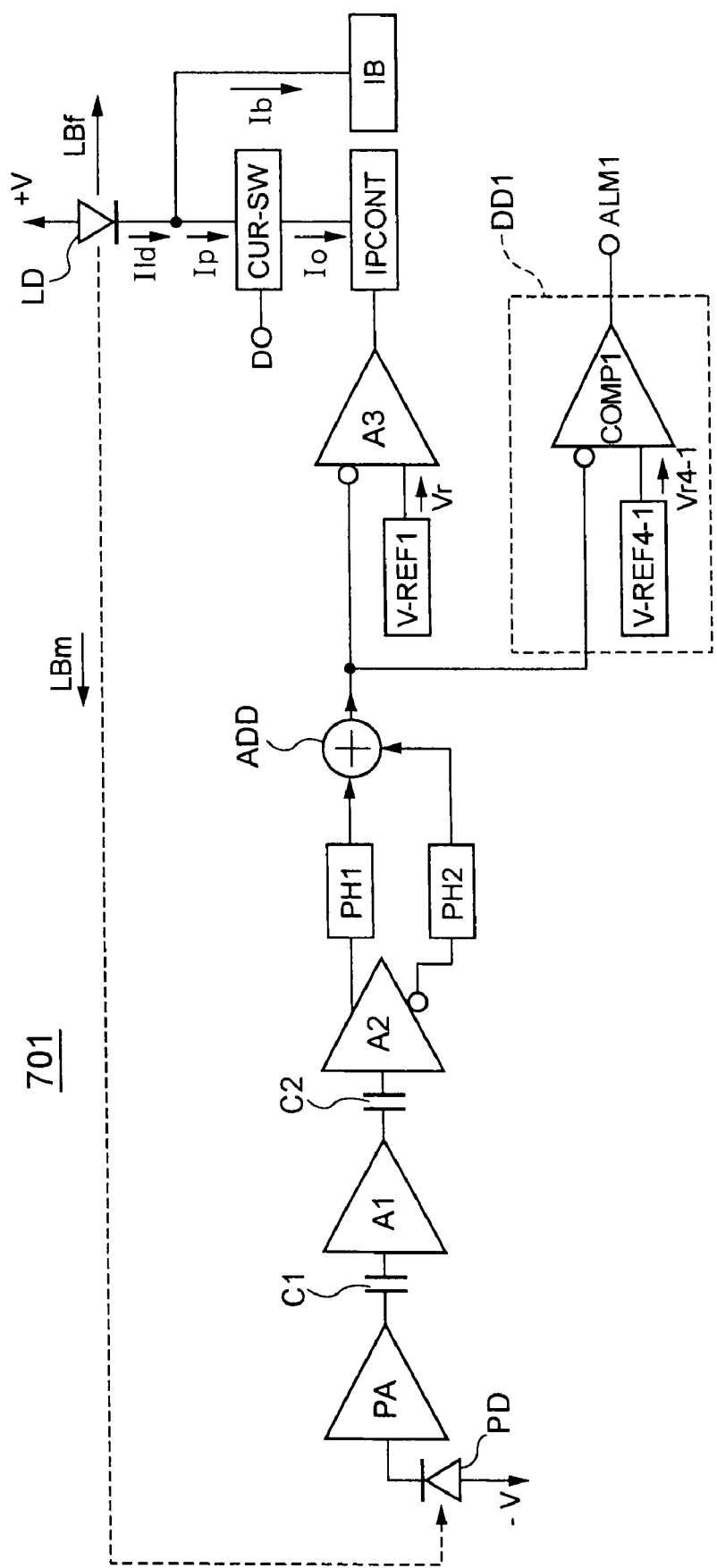
FIG. 19 is a block diagram showing a structure of a laser diode driving circuit according to a seventh embodiment of the present invention.

A laser diode driving circuit (a driving apparatus of a light-emitting device) 701 according to a seventh embodiment of the present invention is shown in FIG. 19.

As compared with the laser diode driving circuit 101 shown in FIG. 2, the laser diode driving circuit 701 has such a configuration that a laser diode degradation detecting section DD1 (a first detecting section) for detecting the degradation of the laser diode LD is added.

The laser diode degradation detecting section DD1 includes a comparator COMP1 and a fourth reference voltage circuit V-REF4-1. A first input terminal of the comparator COMP1 is connected to the output terminal of the adding circuit ADD, and a second input terminal of the comparator COMP1 is connected to an output terminal of the fourth reference voltage circuit V-REF4-1. The comparator COMP1 compares the electrical potential of the addition result voltage signal output from the adding circuit ADD with a fourth reference voltage Vr4-1 output from the fourth reference voltage circuit V-REF4-1, and then outputs a comparison result as an alarm signal ALM1.

In general, a laser diode easily degrades among devices included in the optical communication apparatuses, and the life of the laser diode is relatively short. When the laser diode LD degrades in the laser diode driving circuit 701 of this embodiment, the pulse current Ip (DC current Io) and the DC bias current Ib necessary for obtaining the suitable optical output Pon from the laser diode LD gradually increase. Consequently, the optical output Pon from the laser diode LD does not reach an expected level even though the DC current Io output from the current output circuit IPCONT reaches the maximum value. In this case, the electrical potential of the addition result voltage signal output from the adding circuit ADD also decreases.

The laser diode degradation detecting section DD1 included in the laser diode driving circuit 701 of this embodiment detects a fact that the electrical potential of the addition result voltage signal falls below the fourth reference voltage Vr4-1 output from the fourth reference voltage circuit V-REF4-1, and then outputs the alarm signal ALM1. This alarm signal ALM1 represents the degradation of the laser diode LD.

The addition result voltage signal output from the adding circuit ADD is compared with the fourth reference voltage Vr4-1 output from the fourth reference voltage circuit V-REF4-1 in the laser diode driving circuit 701 of this embodiment. As described above, the addition result voltage signal is obtained by the summation of the peak values of the positive phase voltage signal and the negative phase voltage signal output from the differential output amplifier A2, and the voltage level of the addition result voltage signal is independent from the output offset voltage of the differential output amplifier A2. Therefore, the alarm signal ALM1 is not influenced by the output offset voltage of the differential output amplifier A2, and therefore higher reliability is achieved in detecting the degradation of the laser diode LD.

It should be noted that the output voltage signal from the differential input amplifier A3 may be supplied to the laser diode degradation detecting section DD1 in place of the addition result voltage signal output from the adding circuit ADD, which is compared with the fourth reference voltage Vr4-1 output from the fourth reference voltage circuit V-REF4-1.

The laser diode driving circuit 701 detects the degradation of the laser diode LD by using the addition result voltage signal which varies with the value of the pulse current Ip (DC current Io). Alternatively, the degradation of the laser diode LD may be detected by using a signal which varies with the value of the DC bias current Ib or the summation of the pulse current Ip and the DC bias current Ib.

Figure 20:
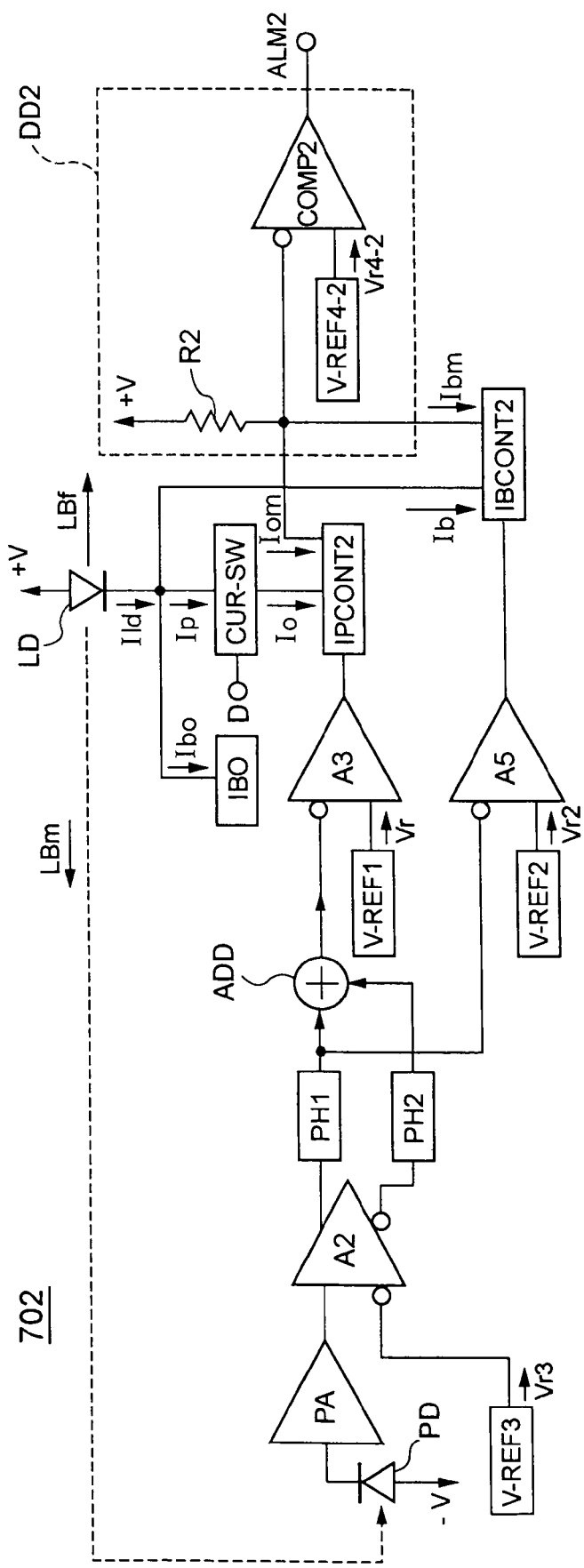
FIG. 20 is a block diagram showing a modified example of the laser diode driving circuit shown in FIG. 19.

The laser diode driving circuit 702 shown in FIG. 20 detects the degradation of the laser diode LD by using a signal which varies with the summation of the pulse current Ip and the DC bias current Ib. As compared with the laser diode driving circuit 502 shown in FIG. 17, the laser diode driving circuit 702 has such a configuration that a current output circuit IPCONT2 is provided in place of the current output circuit IPCONT, a bias current circuit IBCONT2 is provided in place of the bias current circuit IBCONT and a laser diode degradation detecting section DD2 (a second detecting section, a third detection section) for detecting the degradation of the laser diode LD is added.

Similar to the current output circuit IPCONT, the current output circuit IPCONT2 outputs the DC current Io from a first terminal and a DC current Iom from a second terminal. The DC current Iom is proportional to the DC current Io.

Similar to the bias current circuit IBCONT, the bias current circuit IBCONT2 outputs the DC bias current Ib from a first terminal and a DC bias current Ibm from a second terminal. The DC bias current Ibm is proportional to the DC bias current Ib.

The laser diode degradation detecting section DD2 includes a comparator COMP2, a fourth reference voltage circuit V-REF4-2, and a resistance R2.

A second input terminal of the comparator COMP2 is connected to a first terminal of the resistance R2, a first output terminal of the current output circuit IPCONT2, and a first output terminal of the bias current circuit IBCONT2. A first input terminal of the comparator COMP2 is connected to an output terminal of the fourth reference voltage circuit V-REF4-2. A second terminal of the resistance R2 is connected to a supply line of the power supply potential +V.

The resistance R2 adds the DC current Iom and the DC bias current Ibm and converts the addition result to a voltage signal so as to output the voltage signal from the first terminal of the resistance R2. The comparator COMP2 compares an electrical potential of the voltage signal output from the first terminal of the resistance R2 with a fourth reference voltage Vr4-2 output from the fourth reference voltage circuit V-REF4-2, and then outputs a comparison result as an alarm signal ALM2.

The laser diode degradation detecting section DD2 included in the laser diode driving circuit 702 detects a fact that the electrical potential of the voltage signal output from the first terminal of the resistance R2 falls below the fourth reference voltage Vr4-2 output from the fourth reference voltage circuit V-REF4-2, and then outputs the alarm signal ALM2. A voltage drop of the voltage signal output from the first terminal of the resistance R2 corresponds to an increase of a total current of the DC current Io output from the current output circuit IPCONT2 and the DC bias current Ib output from the bias current circuit IBCONT2. As described above, when the laser diode LD degrades, the pulse current Ip (DC current Io) and the DC bias current Ib necessary for obtaining a desired optical output Pon from the laser diode LD gradually increase. Therefore, the degradation of the laser diode LD can be determined by the alarm signal ALM2. Among current components flowing through the laser diode LD of the laser diode driving circuit 702, the DC current Iom and the DC bias current Ibm supplied to the laser diode degradation detecting section DD2 largely vary depending on the respective current control systems when the laser diode LD degrades. On the contrary, the DC bias current Ib0 output from the second bias current circuit IBO does not largely vary even though the laser diode LD degrades. Therefore, the second DC bias current Ib0 is excluded from the reference for determination of the degradation of the laser diode LD. Specifically, the second DC bias current Ibo or a current in proportion to the second DC bias current Ibo is not supplied to the laser diode degradation detecting section DD2. This configuration permits accurate detection of the degradation of the laser diode LD in the laser diode driving circuit 702.

Figure 21:
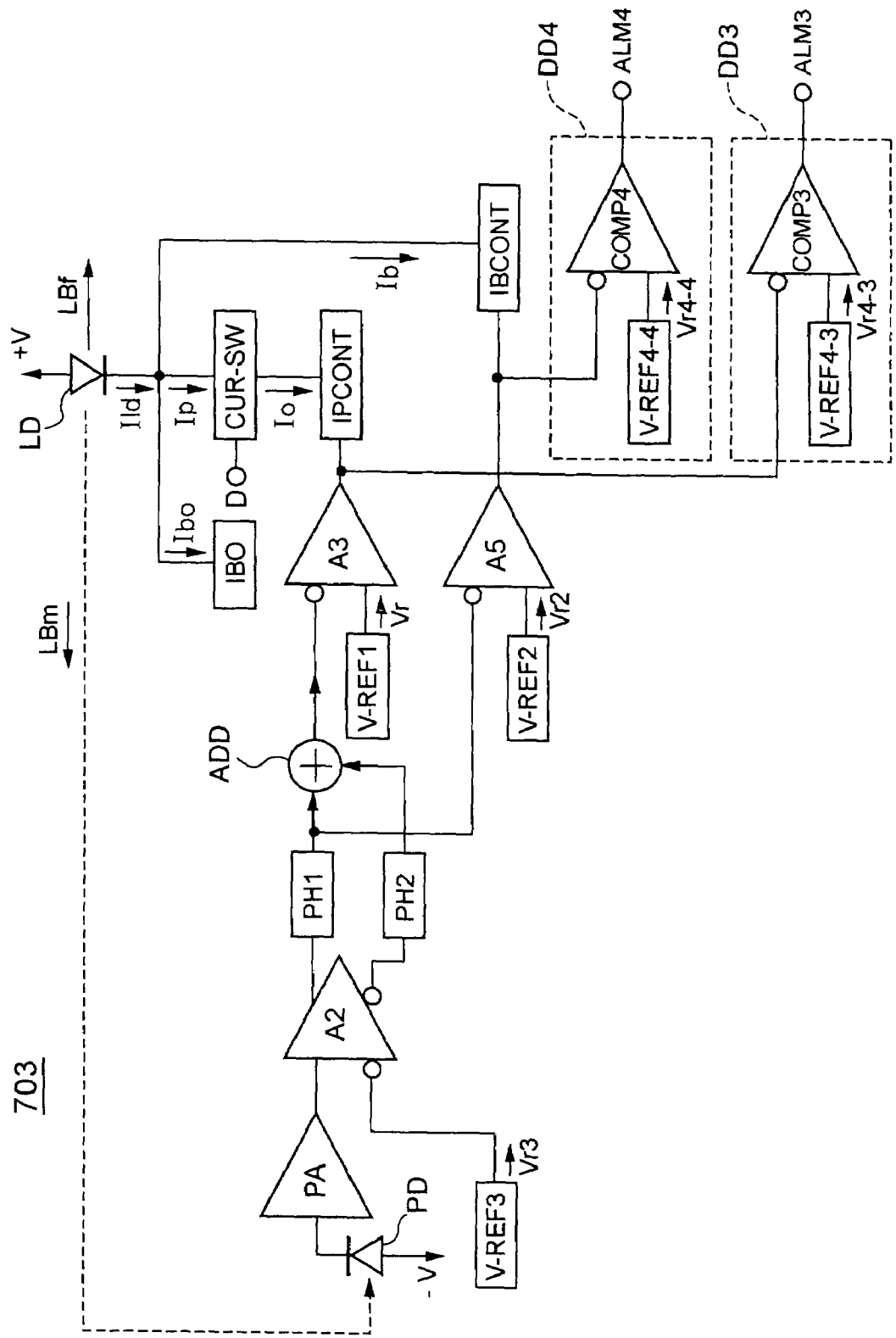
FIG. 21 is a block diagram showing a modified example of the laser diode driving circuit shown in FIG. 19.

The laser diode driving circuit 703 shown in FIG. 21 detects the degradation of the laser diode LD by separately using a signal which varies with the pulse current Ip and a signal which varies with the DC bias current Ib. As compared with the laser diode driving circuit 502 shown in FIG. 17, the laser diode driving circuit 703 has such a configuration that a laser diode degradation detecting section DD3 (a fourth detecting section) and a laser diode degradation detecting section DD4 (a fifth detecting section) for detecting the degradation of the laser diode LD are added.

The laser diode degradation detecting section DD3 includes a comparator COMP3 and a fourth reference voltage circuit V-REF4-3. A first input terminal of the comparator COMP3 is connected to the output terminal of the differential input amplifier A3, and a second input terminal of the comparator COMP3 is connected to the output terminal of the fourth reference voltage circuit V-REF4-3. The comparator COMP3 compares an electrical potential of the voltage signal output from the differential input amplifier A3 with a fourth reference voltage Vr4-3 output from the fourth reference voltage circuit V-REF4-3, and then outputs a comparison result as an alarm signal ALM3.

The laser diode degradation detecting section DD3 configured as described above detects a fact that the electrical potential of the voltage signal output from the differential input amplifier A3 exceeds the fourth reference voltage Vr4-3 output from the fourth reference voltage circuit V-REF4-3, and then outputs the alarm signal ALM3. This alarm signal ALM3 represents the degradation of the laser diode LD.

The laser diode degradation detecting section DD4 includes a comparator COMP4 and a fourth reference voltage circuit V-REF4-4. A first input terminal of the comparator COMP4 is connected to the output terminal of the second differential input amplifier A5, and a second input terminal of the comparator COMP4 is connected to the output terminal of the fourth reference voltage circuit V-REF4-4. The comparator COMP4 compares an electrical potential of the voltage signal output from the second differential input amplifier A5 with a fourth reference voltage Vr4-4 output from the fourth reference voltage circuit V-REF4-4, and then outputs a comparison result as an alarm signal ALM4.

The laser diode degradation detecting section DD4 configured as described above detects a fact that the electrical potential of the voltage signal output from the second differential input amplifier A5 exceeds the fourth reference voltage Vr4-4 output from the fourth reference voltage circuit V-REF4-4, and then outputs the alarm signal ALM4. This alarm signal ALM4 represents the degradation of the laser diode LD.

The laser diode driving circuit 703 detects the degradation of the laser diode LD by using the voltage signal output from the differential input amplifier A3 which varies depending on the value of the pulse current Ip (DC current Io). Furthermore, the laser diode driving circuit 703 detects the degradation of the laser diode LD by using the voltage signal output from the second differential input amplifier A5 which varies depending on the value of the DC bias current Ib. Accordingly, the condition of the laser diode LD can be more accurately monitored.

As described above, the laser diode driving circuits 701, 702 and 703 of this embodiment not only obtain the same advantages as those of the first through fifth embodiments, but also detect the degradation of the laser diode LD more accurately.

Although the preferred embodiments of the present invention have been described with reference to the accompanied drawings, the present invention is not limited to those embodiments. It should be understood that a person skilled in the art can make various changes and modifications without departing from the spirit and scope of the present invention.

Figure 22:
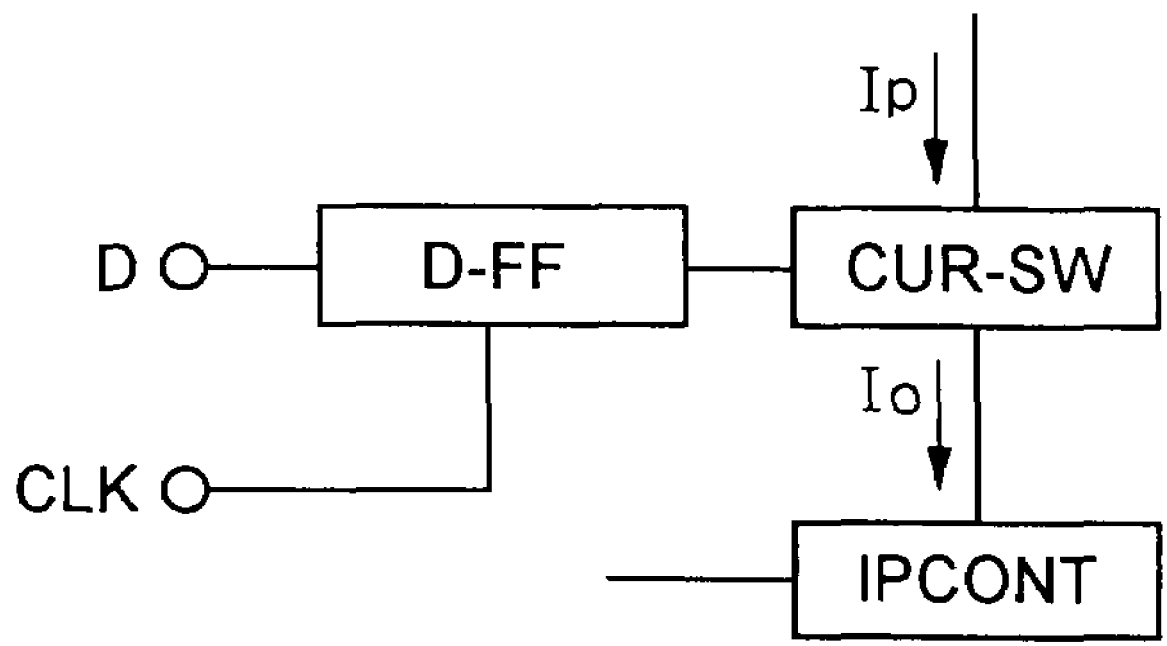
FIG. 22 is a block diagram showing another input scheme to the current switch circuit.

For example, in the first through seventh embodiments, the transmission signal D supplied to the current switch circuit CUR-SW may pass through a D-type flip-flop D-FF as shown in FIG. 22. Accordingly, an input timing of the transmission signal D to the current switch circuit CUR-SW is synchronized with a clock signal CLK.

Figure 23A:
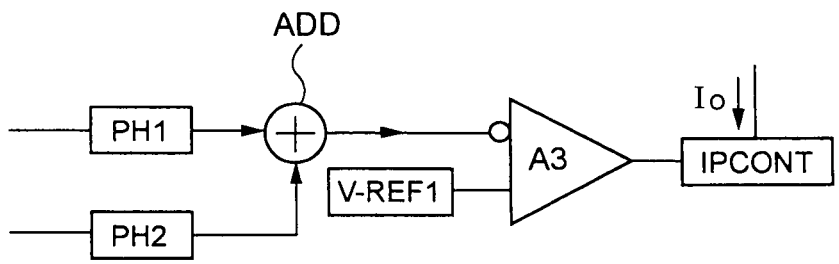
FIGS. 23A to 23D are block diagrams showing four circuits having an interexchangeable portion consisting of an adding circuit, a first reference voltage circuit, and a differential input amplifier.
Figure 23B:
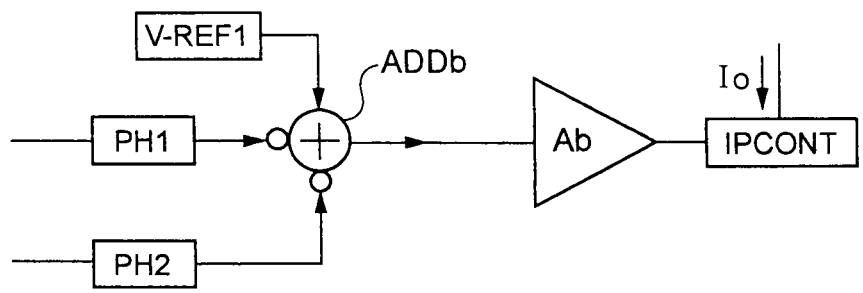
Figure 23C:
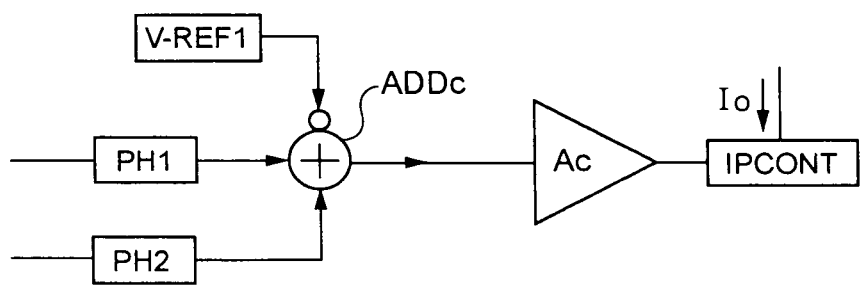
Figure 23D:
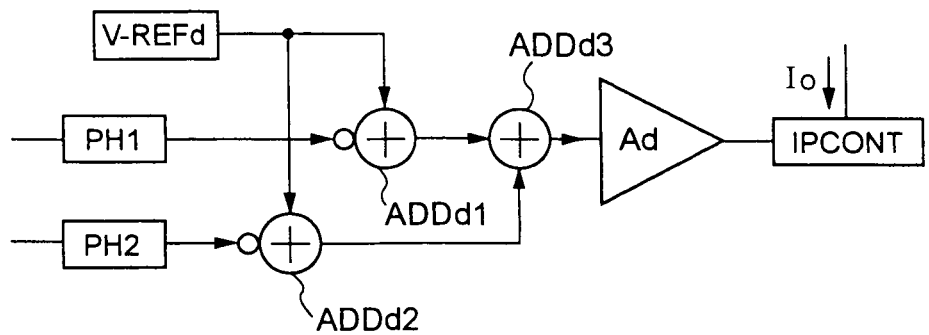

Furthermore, in the first through seventh embodiments, the circuit portion consisting of the adding circuit ADD, the first reference voltage circuit V-REF1, and the differential input amplifier A3 (FIG. 23A) can be replaced with circuits shown in FIGS. 23B through 23D.

In the circuit shown in FIG. 23A, the adding circuit ADD adds the output signal from the first peak hold circuit PH1 and the output signal from the second peak hold circuit PH2, and then supplies the result to the negative phase input terminal of the differential input amplifier A3. The variation of the output from the differential input amplifier A3 is in proportion to the variations of the input at the positive phase input terminal and the input at the negative phase input terminal. Specifically, the differential input amplifier A3 has a function to amplify and output the subtraction result between an input signal to the positive phase input terminal (the reference voltage Vr output from the reference voltage circuit V-REF1) and an input signal to the negative phase input terminal (the addition result voltage signal output from the adding circuit ADD).

A variation of the output voltage ΔVa with respect to the differential input to the differential input amplifier A3 shown in FIG. 23A is expressed by equation (17).

$$\Delta Va = G(VR - (V1 + V2)) \tag{17}$$

In the above equation, G denotes the gain of the differential input amplifier A3, VR denotes the reference voltage Vr output from the reference voltage circuit V-REF1, V1 denotes the electrical potential of the output signal of the first peak hold circuit PH1, and V2 denotes the electrical potential of the output signal of the second peak hold circuit PH2.

The circuit shown in FIG. 23B performs the following operation. Firstly, the adding circuit ADDb subtracts the electrical potential V1 of the output signal of the first peak hold circuit PH1 and the electrical potential V2 of the output signal of the second peak hold circuit PH2 from the reference voltage Vr (electrical potential VR) output from the reference voltage circuit V-REF1, and supplies the result to the amplifier Ab. The amplifier Ab has the gain G which is the same as that of the differential input amplifier A3. The amplifier Ab amplifies and outputs the calculation result of the adding circuit ADDb. Accordingly, a variation of the output voltage, $\Delta Vb$, of the amplifier Ab shown in FIG. 23B is expressed by equation (18).

$$\Delta Vb = G(VR - V1 - V2) \quad (18)$$

From the equation (18) and the equation (17), it is understood that the variation $\Delta Vb$ and the variation $\Delta Va$ coincide with each other.

The circuit shown in FIG. 23C performs the following operation. Firstly, the adding circuit ADDc subtracts the reference voltage Vr (electrical potential VR) output from the reference voltage circuit V-REF1 from the summation of the electrical potential V1 of the output signal of the first peak hold circuit PH1 and the electrical potential V2 of the output signal of the second peak hold circuit PH2, and supplies the result to the amplifier Ac. The amplifier Ac has the gain G which is the same as that of the differential input amplifier A3. The amplifier Ac amplifies and inversely outputs the calculation result of the adding circuit ADDc. Accordingly, a variation of the output voltage, $\Delta Vc$, of the amplifier Ac shown in FIG. 23C is expressed by equation (19).

$$\Delta Vc = -G(V1 + V2 - VR) \quad (19)$$

From the equation (19) and the equation (17), it is understood that the variation $\Delta Vc$ and the variation $\Delta Va$ coincide with each other.

The circuit shown in FIG. 23D performs the following operation. Firstly, the adding circuit ADDd1 subtracts the electrical potential V1 of the output signal of the first peak hold circuit PH1 from an electrical potential VR/2 of the reference voltage signal output from the reference voltage circuit V-REFd, and supplies the result to the adding circuit ADDd3. On the other hand, the adding circuit ADDd2 subtracts the electrical potential V2 of the output signal of the second peak hold circuit PH2 from an electrical potential VR/2 of the reference voltage signal output from the reference voltage circuit V-REFd, and supplies the result to the adding circuit ADDd3. The adding circuit ADDd3 then adds the calculation result of the adding circuit ADDd1 and the calculation result of the adding circuit ADDd2, and supplies the result to the amplifier Ad. The amplifier Ad has the gain G which is the same as that of the differential input amplifier A3. The amplifier Ad amplifies and outputs the calculation result of the adding circuit ADDd3. Accordingly, a variation of the output voltage, $\Delta Vd$, of the amplifier Ad shown in FIG. 23D is expressed by equation (20).

$$\Delta Vd = G((VR/2 - V1) + (VR/2 - V2)) \quad (20)$$

It is obvious from the equations (17) through (20) that circuits shown in FIGS. 23A through 23D are interchangeable with respect to each other.

Figure 27:
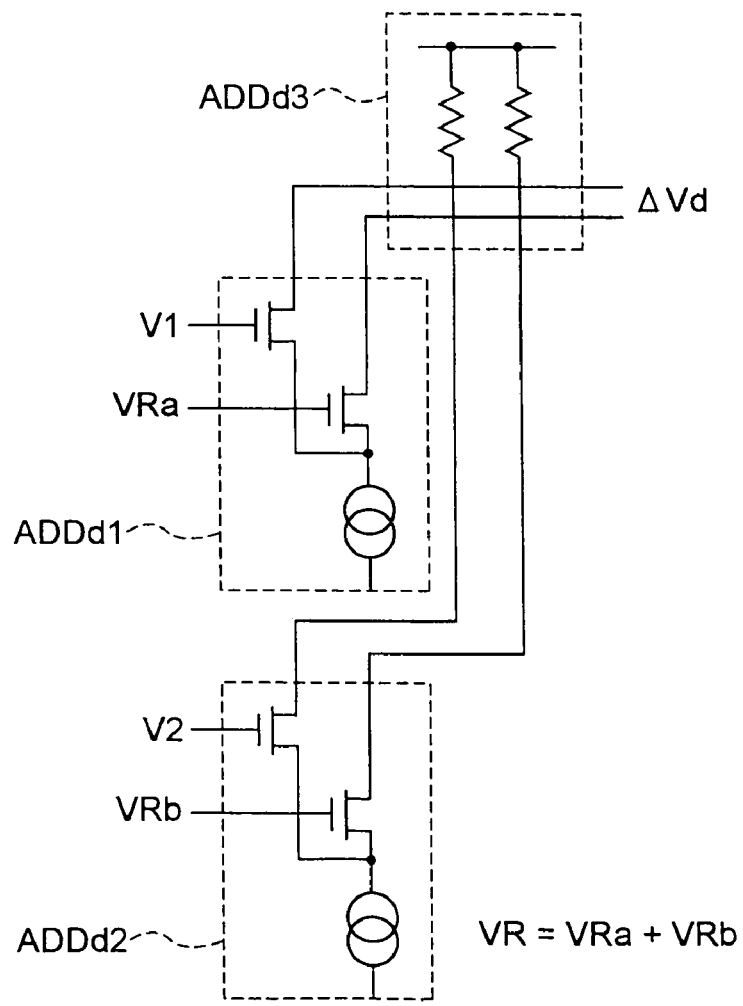
FIG. 27 is a diagram showing the detail of the circuit shown in FIG. 23D.

The reference voltage circuit V-REFd shown in FIG. 23D may be separated into two reference voltage circuits outputting different voltages, i.e., a reference voltage VRa and a reference voltage VRb on condition that those reference voltages satisfy the following equation: VR=VRa+VRb. A specific example of a circuit in the above case is shown in FIG. 27. The adding circuit ADDd1 and the adding circuit ADDd2 respectively performing the subtraction of the output signal of the first peak hold circuit PH1 and the output signal of the second peak hold circuit PH2 can be realized by circuits each having the form of differential voltage input and differential current output. The adding circuit ADDd3 may have a circuit configuration such that a positive phase differential current output from the adding circuit ADDd1 and a positive phase differential current output from the adding circuit ADDd2 are added by a wired-or, and a negative phase differential current output from the adding circuit ADDd1 and a negative phase differential current output from the adding circuit ADDd2 are added by a wired-or. Furthermore, the adding circuit ADDd3 has a function to convert the added currents to voltages by respectively supplying the added currents to resistances. Consequently, the calculation result of the adding circuit ADDd1 and the calculation result of the adding circuit ADDd2 are added in the adding circuit ADDd3. As described above, the calculation circuit diagram shown in FIG. 23D is realized by an extremely simple circuit configuration shown in FIG. 27.

The circuit portion consisting of the second reference voltage circuit V-REF2 and the differential input amplifier A5 shown in the above embodiments can be replaced with another circuit in a similar manner as described with reference to FIGS. 23B to 23D. Furthermore, in a similar manner, the circuit portion consisting of the third reference voltage circuit V-REF3 the differential input-output amplifier A2-2 can be replaced with another circuit.

Figure 24A:
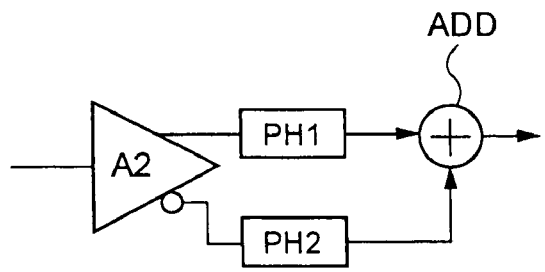
FIGS. 24A to 24C are block diagrams of three circuits having an interexchangeable first peak hold circuit and an interexchangeable second peak hold circuit.
Figure 24B:
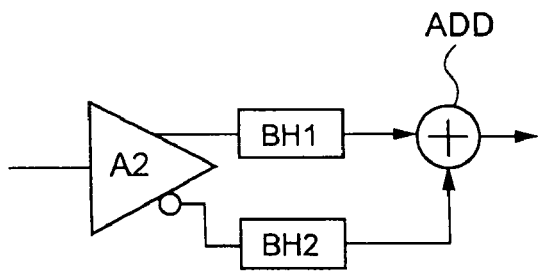

As shown in FIGS. 24A and 24B, the first peak hold circuit PH1 and the second peak hold circuit PH2 in the first through seventh embodiments can be replaced with the first bottom hold circuit BH1 and the second bottom hold circuit BH2. The first bottom hold circuit BH1 holds a bottom potential of the positive phase voltage signal output from the differential output amplifier A2, and the second bottom hold circuit BH2 holds a bottom potential of the negative phase voltage signal output from the differential output amplifier A2.

Figure 24C:
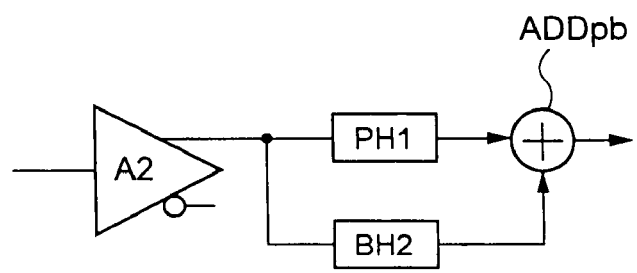

As shown in FIGS. 24A and 24C, the first peak hold circuit PH1, the second peak hold circuit PH2, and the adding circuit ADD can be replaced with the first peak hold circuit PH1, the first bottom hold circuit BH1, and the adding circuit ADDpb. In this instance, it is necessary to adjust a level shift characteristic and so on between the first peak hold circuit PH1 and the first bottom hold circuit BH1. In a similar manner, the first peak hold circuit PH1, the second peak hold circuit PH2, and the adding circuit ADD can be replaced with the second peak hold circuit PH2, the second bottom hold circuit BH2, and the adding circuit ADDpb.

Figure 25:
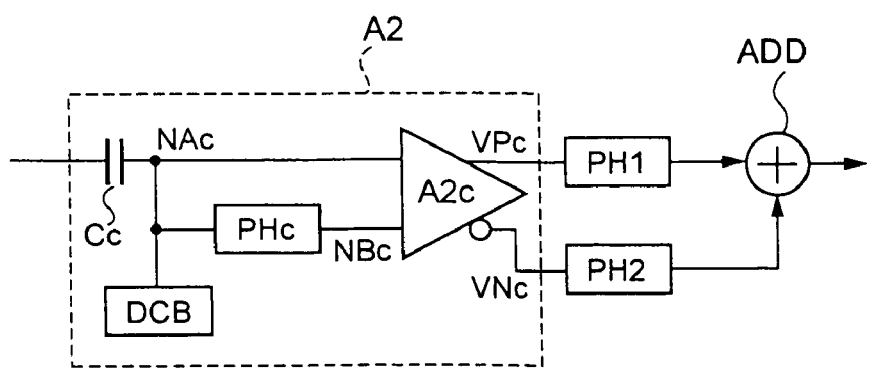
FIG. 25 is a block diagram showing an example of the differential output amplifier.

The laser diode driving circuit configured to control either one of the current output circuit IPCONT or the bias current circuit IBCONT, such as the laser diode driving circuit 101 and the laser diode driving circuit 102 of the first embodiment, is required to detect only the amplitude information of the optical output Pon from the laser diode LD. Therefore, the differential output amplifier A2 may have such a configuration as shown in FIG. 25.

Specifically, the differential output amplifier A2 includes a differential input-output amplifier A2c, a capacitor Cc, a DC bias voltage output section DCB, and a peak hold circuit PHc.

The capacitor Cc cuts off a DC component in a signal supplied from the circuits provided before the capacitor Cc, and supplies only a pulse component to a first input terminal of the differential input-output amplifier A2c. The DC bias voltage output section DCB supplies the DC bias voltage to the first input terminal of the differential input-output amplifier A2c via a suitable impedance. The peak hold circuit PHc detects a peak voltage value of the first input terminal of the differential input-output amplifier A2c, and supplies the peak voltage value to a second input terminal of the differential input-output amplifier A2c.

Figure 26:
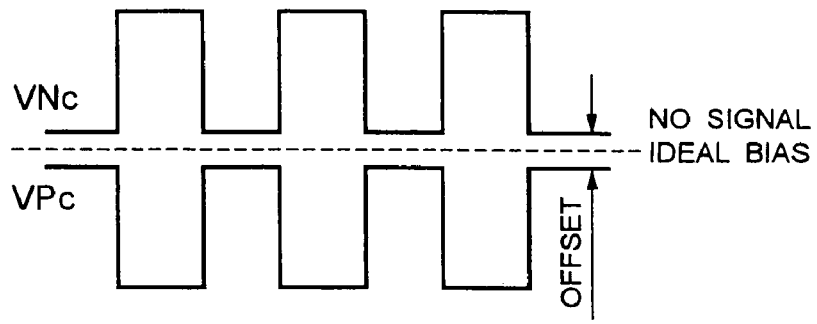
FIG. 26 is a waveform chart showing an operation of the differential output amplifier shown in FIG. 25.

A DC potential at a node NAc of the differential output amplifier A2 having the aforementioned configuration fluctuates depending on an 1/0 ratio of the pulse signal passing through the node NAc (FIG. 26). It is preferable to set a discharge time constant of the peak hold circuit PHc such that the discharge time constant is sufficiently larger than the width of the passing pulse signal and is sufficiently smaller than a fluctuation time constant of the node NAc, so that the fluctuation of the DC potential at the node NBc follows the fluctuation of the DC potential at the node NAc.

Adjustment of characteristics of the power supply dependence and the temperature dependence of the DC bias voltage output from the reference voltage circuit V-REF3 to the characteristics of the power supply dependence and the temperature dependence of the DC bias voltage output from the preamplifier section PA has been described in the foregoing description. Therefore, outputs from other reference voltage circuits become the DC bias voltage plus the variation. Thus, it is preferable to adjust the characteristics of the power supply dependence and the temperature dependence of the DC bias voltage output from all of the reference voltage circuits such as the reference voltage circuit V-REF1 and the reference voltage circuit V-REF2 to the characteristics of the power supply dependence and the temperature dependence of the DC bias voltage output from the circuit, which is an object of comparison, such as a circuit including the first peak hold circuit PH1, the second peak hold circuit PH2, and the adding circuit ADD.

This application is based on a Japanese patent application No. 2003-198030, the entire disclosure of which is incorporated herein by reference.

What is claimed is:

1. A driving apparatus of a light-emitting device for driving an light-emitting device to generate an optical pulse signal based on a transmission pulse signal comprising:
    a light-receiving device for receiving monitoring light emitted from the light-emitting device and outputting a light-receiving current signal;
    a current-to-voltage conversion section for converting the light-receiving current signal to a voltage signal;
    an AC coupling amplifier section for amplifying an AC component of the voltage signal output from the current-to-voltage conversion section and outputting an AC amplified signal;
    a differential output section for amplifying the AC amplified signal and outputting a positive phase voltage signal and a negative phase voltage signal;
    a first detecting circuit for detecting a peak value or a bottom value of the positive phase voltage signal and outputting a voltage depending on the peak value or the bottom value;
    a second detecting circuit for detecting a peak value or a bottom value of the negative phase voltage signal and outputting a voltage depending on the peak value or the bottom value of the negative phase voltage signal;
    a first reference voltage circuit for generating a first reference voltage;
    a first calculation section for adding an output voltage of the first detecting circuit and an output voltage of the second detecting circuit, and for outputting a voltage depending on a difference between a result of the adding and the first reference voltage;
    a first DC current output section for outputting a first DC current depending on a calculation result of the first calculation section;
    a pulse current output section for converting the first DC current to a pulse current depending on the transmission pulse signal so as to supply the pulse current to the light-emitting device; and
    a bias current output section for supplying a bias current to the light-emitting device.

2. A driving apparatus of a light-emitting device for driving an light-emitting device to generate an optical pulse signal based on a transmission pulse signal comprising:
    a light-receiving device for receiving monitoring light emitted from the light-emitting device and outputting a light-receiving current signal;
    a current-to-voltage conversion section for converting the light-receiving current signal to a voltage signal;
    an AC coupling amplifier section for amplifying an AC component of a voltage signal output from the current-to-voltage conversion section and outputting an AC amplified signal;
    a differential output section for amplifying the AC amplified signal and outputting a positive phase voltage signal and a negative phase voltage signal;
    a first detecting circuit for detecting a peak value or a bottom value of the positive phase voltage signal and outputting a voltage depending on the peak value or the bottom value;
    a second detecting circuit for detecting a peak value or a bottom value of the negative phase voltage signal and outputting a voltage depending on the peak value or the bottom value of the negative phase voltage signal;
    a first reference voltage circuit for generating a first reference voltage;
    a first calculation section for adding an output voltage of the first detecting circuit and an output voltage of the second detecting circuit, and for outputting a voltage depending on a difference between a result of the adding and the first reference voltage;
    a bias current output section for supplying a bias current depending on a calculation result of the first calculation section to the light-emitting device; and
    a pulse current output section for supplying a pulse current depending on the transmission pulse signal to the light-emitting device.

3. A driving apparatus of a light-emitting device for driving an light-emitting device to generate an optical pulse signal based on a transmission pulse signal comprising:
    a light-receiving device for receiving monitoring light emitted from the light-emitting device and outputting a light-receiving current signal;
    a current-to-voltage conversion section for converting the light-receiving current signal to a voltage signal;
    a differential output amplifier section for amplifying a voltage signal output from the current-to-voltage conversion section, and for outputting a positive phase voltage signal and a negative phase voltage signal;
    a first detecting circuit for detecting a peak value or a bottom value of the positive phase voltage signal and outputting a voltage depending on the peak value or the bottom value;
    a second detecting circuit for detecting a peak value or a bottom value of the negative phase voltage signal and outputting a voltage depending on the peak value or the bottom value of the negative phase voltage signal;
    a first reference voltage circuit for generating a first reference voltage;
    a first calculation section for adding an output voltage of the first detecting circuit and an output voltage of the second detecting circuit, and for outputting a voltage depending on a difference between a result of the adding and the first reference voltage;

a second reference voltage circuit for generating a second reference voltage;

a second calculation section for outputting a voltage depending on a difference between an output voltage of the first detecting circuit or an output voltage of the second detecting circuit and the second reference voltage;

a first DC current output section for outputting a first DC current depending on a calculation result of the first calculation section;

a pulse current output section for converting the first DC current to a pulse current depending on the transmission pulse signal so as to supply the pulse current to the light-emitting device; and a bias current output section for supplying a bias current depending on a calculation result of the second calculation section to the light-emitting device.

4. A driving apparatus of a light-emitting device for driving an light-emitting device to generate an optical pulse signal based on a transmission pulse signal comprising:

a light-receiving device for receiving monitoring light emitted from the light-emitting device and outputting a light-receiving current signal;

a current-to-voltage conversion section for converting the light-receiving current signal to a voltage signal;

a third reference voltage circuit for generating a third reference voltage;

a differential input differential output amplifier section for amplifying an electrical potential difference between a voltage signal output from the current-to-voltage conversion section and the third reference voltage so as to output a positive phase voltage signal and a negative phase voltage signal;

a first detecting circuit for detecting a peak value or a bottom value of the positive phase voltage signal and outputting a voltage depending on the peak value or the bottom value;

a second detecting circuit for detecting a peak value or a bottom value of the negative phase voltage signal and outputting a voltage depending on the peak value or the bottom value of the negative phase voltage signal;

a first reference voltage circuit for generating a first reference voltage;

a first calculation section for adding an output voltage of the first detecting circuit and an output voltage of the second detecting circuit, and for outputting a voltage depending on a difference between a result of the adding and the first reference voltage;

a first DC current output section for outputting a first DC current depending on a calculation result of the first calculation section;

a pulse current output section for converting the first DC current to a pulse current depending on the transmission pulse signal so as to supply the pulse current to the light-emitting device; and a bias current output section for supplying a bias current to the light-emitting device.

5. A driving apparatus of a light-emitting device for driving an light-emitting device to generate an optical pulse signal based on a transmission pulse signal comprising:

a light-receiving device for receiving monitoring light emitted from the light-emitting device and outputting a light-receiving current signal;

a current-to-voltage conversion section for converting the light-receiving current signal to a voltage signal;

a third reference voltage circuit for generating a third reference voltage;

a differential input differential output amplifier section for amplifying an electrical potential difference between a voltage signal output from the current-to-voltage conversion section and the third reference voltage so as to output a positive phase voltage signal and a negative phase voltage signal;

a first detecting circuit for detecting a peak value or a bottom value of the positive phase voltage signal and outputting a voltage depending on the peak value or the bottom value;

a second detecting circuit for detecting a peak value or a bottom value of the negative phase voltage signal and outputting a voltage depending on the peak value or the bottom value of the negative phase voltage signal;

a first reference voltage circuit for generating a first reference voltage;

a first calculation section for adding an output voltage of the first detecting circuit and an output voltage of the second detecting circuit, and for outputting a voltage depending on a difference between a result of the adding and the first reference voltage;

a bias current output section for supplying a bias current depending on a calculation result of the first calculation section to the light-emitting device; and a pulse current output section for supplying a pulse current depending on the transmission pulse signal to the light-emitting device.

6. A driving apparatus of a light-emitting device for driving a light-emitting device to generate an optical pulse signal based on a transmission pulse signal comprising:

a light-receiving device for receiving monitoring light emitted from the light-emitting device and outputting a light-receiving current signal;

a current-to-voltage conversion section for converting the light-receiving current signal to a voltage signal;

a third reference voltage circuit for generating a third reference voltage;

the differential input differential output amplifier section having two input terminals, a positive phase output terminal and a negative phase output terminal, for receiving a voltage signal output from the current-to-voltage conversion section at one of the two input terminals and receiving the third reference voltage at the other input terminal, and for outputting a positive phase voltage signal from the positive phase output terminal and outputting a negative phase voltage signal from the negative phase output terminal;

a first detecting circuit for detecting a peak value or a bottom value of the positive phase voltage signal and outputting a voltage depending on the peak value or the bottom value;

a second detecting circuit for detecting a peak value or a bottom value of the negative phase voltage signal and outputting a voltage depending on the peak value or the bottom value of the negative phase voltage signal;

a first reference voltage circuit for generating a first reference voltage;

a first calculation section for adding an output voltage of the first detecting circuit and an output voltage of the second detecting circuit, and for outputting a voltage depending on a difference between a result of the adding and the first reference voltage;

a second reference voltage circuit for generating a second reference voltage;

a second calculation section for outputting a voltage depending on a difference between an output voltage of the first detecting circuit or an output voltage of the second detecting circuit and the second reference voltage;

a first DC current output section for outputting a first DC current depending on a calculation result of the first calculation section;

a pulse current output section for converting the first DC current to a pulse current depending on the transmission pulse signal so as to supply the pulse current to the light-emitting device; and a bias current output section for supplying a bias current depending on a calculation result of the second calculation section to the light-emitting device.

7. The driving apparatus of a light-emitting device according to claim 4, wherein the third reference voltage is adjusted to an electrical potential of a voltage signal output from the current-to-voltage conversion section when no light is emitted from the light-emitting device.

8. The driving apparatus of a light-emitting device according to claim 1, wherein the first calculation section includes a first time constant circuit.

9. The driving apparatus of a light-emitting device according to claim 3, wherein the first calculation section includes a first time constant circuit and the second calculation section includes a second time constant circuit.

10. The driving apparatus of a light-emitting device according to claim 1 further including a second bias current output section for supplying a second bias current to the light-emitting device.

11. The driving apparatus of a light-emitting device according to claim 1, wherein a gain of the AC coupling amplifier section is adjustable from external.

12. The driving apparatus of a light-emitting device according to claim 3, wherein a gain of the differential output amplifier section is adjustable from external.

13. The driving apparatus of a light-emitting device according to claim 4, wherein a gain of the differential input differential output amplifier section is adjustable from external.

14. The driving apparatus of a light-emitting device according to claim 1 further including a first detecting section for determining whether the calculation result of the first calculation section exceeds a predetermined value.

15. The driving apparatus of a light-emitting device according to claim 1 further including a second detecting section for determining whether a value of the first DC current exceeds a predetermined value.

16. The driving apparatus of a light-emitting device according to claim 1 further including a third detecting section for determining whether a value of the bias current exceeds a predetermined value.

17. The driving apparatus of a light-emitting device according to claim 3 further including a fourth detecting section for determining whether the calculation result of the second calculation section exceeds a predetermined value.

18. The driving apparatus of a light-emitting device according to claim 1 further including a fifth detecting section for determining whether a summation of currents flowing through the pulse current output section and the bias current output section exceeds a predetermined value.

19. The driving apparatus of a light-emitting device according to claim 1, wherein the light-emitting device is used for transmitting a burst signal.

20. A driving apparatus of a light-emitting device for driving an light-emitting device to generate an optical pulse signal based on a transmission pulse signal comprising:

light-receiving means for receiving monitoring light emitted from the light-emitting device and outputting a light-receiving current signal;

current-to-voltage conversion means for converting the light-receiving current signal to a voltage signal;

AC coupling amplifier means for amplifying an AC component of a voltage signal output from the current-to-voltage conversion means and outputting an AC amplified signal;

differential output means for amplifying the AC amplified signal and outputting a positive phase voltage signal and a negative phase voltage signal;

first detecting means for detecting a peak value or a bottom value of the positive phase voltage signal and outputting a voltage depending on the peak value or the bottom value;

second detecting means for detecting a peak value or a bottom value of the negative phase voltage signal and outputting a voltage depending on the peak value or the bottom value of the negative phase voltage signal;

first reference voltage means for generating a first reference voltage;

first calculation means for adding an output voltage of the first detecting means and an output voltage of the second detecting means, and for outputting a voltage depending on a difference between a result of the adding and the first reference voltage;

first DC current output means for outputting a first DC current depending on a calculation result of the first calculation means;

pulse current output means for converting the first DC current to a pulse current depending on the transmission pulse signal so as to supply the pulse current to the light-emitting device; and bias current output means for supplying a bias current to the light-emitting device.

* * * * *